(12) United States Patent
Krivokapic et al.

(10) Patent No.: US 6,304,836 B1
(45) Date of Patent: *Oct. 16, 2001

(54) WORST CASE DESIGN PARAMETER EXTRACTION FOR LOGIC TECHNOLOGIES

(75) Inventors: Zoran Krivokapic, Santa Clara; William D. Heavlin, El Granada, both of CA (US)

(73) Assignee: Advanced Micro Devices, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/112,606

(22) Filed: Jul. 9, 1998

Related U.S. Application Data

(63) Continuation-in-part of application No. 08/738,542, filed on Oct. 28, 1996.

(51) Int. Cl.[7] .............................. G06F 17/50; G06G 7/62
(52) U.S. Cl. ................................................ 703/14; 703/13
(58) Field of Search ........................................ 703/13–14

(56) References Cited

U.S. PATENT DOCUMENTS

| | | | |
|---|---|---|---|
| 3,751,647 | 8/1973 | Maeder et al. | 235/151.11 |
| 4,792,913 * | 12/1988 | Buckland et al. | 708/3 |
| 4,901,242 | 2/1990 | Kotan . | |
| 5,065,103 * | 11/1991 | Slinkman et al. | 324/458 |
| 5,105,362 | 4/1992 | Kotani | 364/468 |
| 5,111,404 | 5/1992 | Kotani . | |
| 5,260,865 | 11/1993 | Beauford et al. . | |
| 5,301,118 | 4/1994 | Heck et al. | 364/468 |
| 5,319,564 * | 6/1994 | Smayling et al. | 703/13 |
| 5,341,302 | 8/1994 | Connors et al. | 364/468 |
| 5,392,227 * | 2/1995 | Hiserote | 703/14 |
| 5,394,346 * | 2/1995 | Milsom et al. | 703/14 |

(List continued on next page.)

OTHER PUBLICATIONS

Root et al.; "Statistical Circuit Simulation with Measurement–Based Active Device Models: Implications for Process Control and IC Manufacturability"; IEEE GaAs IC Symposium; pp. 124–127, 1995.*

Adele Cutler and Leo Breiman, Archetypal Analysis, Technometrics, vol. 36, No. 4, Nov. 1994, 11 pages.

Zoran Krivokapic and William D. Heavlin, Advanced Micro Devices, Inc., *Gate Module as the Dominant Source of Manufacturing Variations*, 10 pages.

(List continued on next page.)

*Primary Examiner*—Kevin J. Teska
*Assistant Examiner*—Hugh Jones
(74) *Attorney, Agent, or Firm*—Amin & Turocy, LLP

(57) ABSTRACT

The present invention provides for more realistic worst case extreme determinations for an integrated circuit as compared to conventional techniques. In particular, the present invention provides a framework which affords for improved linkage between semiconductor manufacturing process parameters and an integrated circuit designed based on the electrical properties of cells making up the integrated circuit. The present invention divides an integrated circuit into simple standard cells and more complex cells. For simple standard cells (e.g., XOR, NAND, NOR, inverter), a premodeling step is performed to model the simple standard cell as a circuit in order to obtain gate delay and power consumption distributions related thereto. Such premodeling affords for more accurate semiconductor physical parameters to be employed to generate the normalized distribution of the integrated circuit which in turn provides for better worst case extremes. More complex cells are modeled with I/V curves distributions for understanding the effects of semiconductor device attribute choices, such as channel length, effects of "guard band" or manufacturability of such devices. As a result of the present invention, IC circuits may be manufactured with more realistic or practical worst case extreme parameters and thus, more densely designed and manufactured without substantially sacrificing operability.

33 Claims, 16 Drawing Sheets

U.S. PATENT DOCUMENTS

| | | | |
|---|---|---|---|
| 5,402,367 | | 3/1995 | Sullivan et al. .................... 364/578 |
| 5,438,527 | | 8/1995 | Feldbaumer et al. . |
| 5,495,417 | * | 2/1996 | Fuduka et al. ....................... 700/121 |
| 5,502,643 | | 3/1996 | Fujinaga . |
| 5,581,475 | | 12/1996 | Majors ................................ 364/491 |
| 5,629,877 | | 5/1997 | Tamegaya et al. . |
| 5,646,870 | | 7/1997 | Krivokapic et al. ................. 364/578 |
| 5,655,110 | | 8/1997 | Krivokapic et al. ................. 395/500 |
| 5,719,796 | | 2/1998 | Chen .................................... 364/578 |
| 5,724,251 | | 3/1998 | Heavlin ............................... 364/491 |
| 5,966,527 | * | 10/1999 | Krivokapic et al. .................. 703/14 |

OTHER PUBLICATIONS

Suresh B. Pahwa, et al., Oil and Gas Journal, Microcumputers Aid Investment Decisions, Feb. 11, 1985; Microcomputer Report; 8 pages.

Boning, et al., "DOE/OPT: A System for Design of Experiments, Response Surface Modeling & Optimization Using Process & Device Simulation," IEEE Trans on Semiconductor Mfg., vol. 7, Iss. 2, May 1994, pp. 233–244.

Boskin, et al., "A Method for Modeling the Manufacturability of IC Designs," Proc IEEE Int. Conf. On Microelectronics Test Structures, vol. 6, Mar. 1993, p. 241–24.

Dance, et al., "Appl. Of Yield Models for Semiconductor Yield Improvement," Defect & fault Tolerance on VLSI Systems, 1992 p. 257–266.

Dill, et al., "Modeling Positive Photoresist," Proceedings of the Kodak Microelectronics Seminar, Oct. 1974, pp. 24–31.

Duvall, "Towards a Practical Methodology for the Statistical Design of Complex IC Products," 1993 VLSI TSA, pp. 112–116.

Heavlin, W.D. and Finnegan, G.P., "Dual Space Algorithms for Designing Space–filling Experiments," Interface 1994, Research Triangle, North Carolina, Jun. 1994, pp. 41–47.

Heavlin, "Variance Components & Computer Experiments," Proc 1994 Amer. Statistical Assoc., pp. 103–108.

Huang, J.H., et al., "BSIM3 Manual, version 2.0", Department of Electrical Engineering and Computer Science, University of California, Berkeley, CA, 1994 (218 pages).

Iravani, et al., "Statistical Modeling Tools, methods & Applications for IC Mfg." Proc IEEE '95 Conf. On Microelectronic Test Structures, vol. 8, Mar. 1995, pp. 203–207.

Kaplan, S. and Karklin, L., "Calibration of Lithography Simulator by Using Sub–Resolution Patterns," Proceedings on Optical/Laser Microlithography VI, SPIE 1927, pp. 858–867, 1993.

Kizilyalli, et al., "Predictive Worst Case Statistical Modeling of 0.8 mu m BICMOS Bipolar Transistors: A methodology Based on Process & Mixed Device/Circuit Level Simulators," IEEE Trans. On Electron Devices, vol. 40, No. 5, May 1993, pp. 966–973.

Krivokapic, Z. and Heavlin, W.D., "Predicting Manufacturing Variabilities for Deep Micron Technologies: Integration of Process, Device, and Statistical Simulations," in Simulation of Semiconductor Devices and Processes, 5, S. Selberherr, H. Stippel and E. Strasser, eds, pp. 229–232, Springer–Verlag, New York, 1993.

Lopez–Serrano, et al., "Yield Enhancement Prediction with Statistical Process Simulations in an Advanced Poly–emitter Complementary Bipolar Technology," IEEE 1994 Custom IC Cont., pp. 13.1.1(289)–13.1.4(292).

Mack, Development of Positive Photoresists, Jour. Electro. Chem. Soc: Solid State Sci. & Tech., vol. 134, Issue 1, Jan. 1987, pp. 148–152.

Mack, C. and Charrier, E., "Yield Modeling for Photlithography," Proceedings of OCG Microlithography Seminar, pp. 171–182, 1994.

Mandel, "The Statistical Analysis of Experimental Data," John Wiley & Sons, 1964, Chap. 12, pp. 272–311.

Neureuther, et al., "Photoresist Modeling & Device Fabrication Appl.," Optical & Acoustical Microelectronics, 1974, pp. 223–249.

Niu, et al., "A Bayesian Approach to Variable Screening for Modeling the IC Fabrication Process, " Circuits & Systems, 1995 IEEE Int'l Symposium, pp. 1227–1230.

Owen, "Controlling Correlations in Latin Hypercube Samples," 1994 Jour. Amer. Statistical Assoc., vol. 89 No. 428, Dec. 1994, pp. 1517–1522.

Pinto, et al., "ULSI Tech. Dev. By Predictive Simulation," 1993 IEEE, pp. 29.1.1–29.1.4.

Rietman, et al., Process Models & Network Complexity, 1993 Int'l. Conf. On Neural Networks, pp. 1265–1269.

Ripley, B.D., Spatial Statistics, pp. 44–74, Wiley, New York, 1981.

Smith, et al., "Comparision of scalar & vector diffraction modeling for deep–UV lithography," SPIE vol. 1927 Optical/Laser Microlithography VI–1993, pp. 847–857.

Stein, "Large Sample Properties of Simulations Using Latin Hypercube Sampling," Technometrics, vol. 29, Iss. 2, May 1987, pp. 143–151.

Welten, et al., "Statistical Worst–Case Simulation for CMOS Technology," IEEE Colloq. No. 153: Improving the Efficiency of IC Mfg. Technology, 1995 (3 pages).

Williams, et al., "Application of Process Statistics to Macro/ Behavioral Modeling" IEEE 1993, pp. 515–518.

* cited by examiner

Validation histograms for n-channel drive currents. Drive currents are normalized to the mean value of empirical data.

Distribution of p-channel drive currents for six dice in the reticle field (conventional illumination)

WORST CASE DESIGN PARAMETER EXTRACTION FOR LOGIC TECHNOLOGIES

CROSS-REFERENCE TO RELATED APPLICATION

This is a continuation-in-part of copending U.S. application Ser. No. 08/738,542, filed Oct. 28, 1996, the entire disclosure of which is incorporated by reference.

TECHNICAL FIELD

The present invention relates generally to designing and manufacturing semiconductor devices, such as Field Effect Transistors ("FET"), and more particularly to modeling or simulating a semiconductor device manufactured under typical mass-produced conditions.

BACKGROUND OF THE INVENTION

An integrated circuit ("IC") designer must consider numerous transistor attributes, such as channel length and doping concentration, in modeling or predicting semiconductor behavior or operation. Often, an IC designer must balance conflicting transistor attributes in achieving desired semiconductor behavior, such as a specified drain-to-source current vs. drain-to-source voltage curve ("I/V curve"). For example, in order to improve transistor speed, an IC designer may increase current drive and thus speed up the charge and discharge of capacitive loads. This generally requires shorter channel lengths and a thin gate oxide thickness. Similarly, an IC designer may desire to shorten channel lengths to minimize the size of the semiconductor device. However, shorter channel lengths may cause a drop in threshold voltage, among other problems, all of which lead to undesirable higher leakage current.

Various semiconductor device simulators have been built to model designed transistor behavior. Device simulators, such as PISCES, Medici, Suprem3, Suprem4, PdFad, and MINIMOS have been developed to emulate semiconductor behavior based upon specified transistor attributes, such as doping concentration, channel length, gate oxide thickness, junction depth and so on.

FIG. 1 illustrates a prior art method for modeling an integrated circuit, and in particular to obtain I/V curves for a transistor having specified attributes as illustrated in FIG. 2. FIG. 2 illustrates an n-channel metal oxide semiconductor ("NMOS") device 200 formed on a substrate 201. NMOS device 200 may be part of a complementary metal oxide semiconductor ("CMOS") device. Device 200 includes, among other specified transistor attributes, a specified channel length L, doping concentration N+ in a respective source and drain, and gate oxide thickness T. Only a few of the numerous transistor attributes typically found in a semiconductor device are illustrated in FIG. 2.

Before an accurate model of NMOS device 200 may be obtained, certain "parameters" must be extracted from the device 200, as illustrated in FIG. 1. Typically, a device simulator requires specific device "parameters" in order to provide a simulation. For example, the semiconductor device simulator may require five specific sets of parameters as illustrated by parameters 103–107. Some of the parameters are extracted from a device parameter extractor 102. Some of these parameters may correspond to physical measurements of the device 200, such as channel length L and doping concentration N+, while other parameters may be based on or derived from these physical measurements or other parameters.

Device parameter extractor 102 may include a personal computer and a signal analyzer coupled to a probe station for measuring signals from the device 200. The signals may include drain-to-source current, $I_{DS}$, drain-to-source voltage $V_{DS}$ and gate voltage $V_G$ measurements. Parameters associated with the single semiconductor device 200 or multiple semiconductor devices 200 having varying attributes, such as a shorter channel length and higher doping concentration, may be extracted by device parameter extractor 102.

The five sets of parameters 103–107 illustrate parameters associated with a particular semiconductor device, for example, a CMOS device. Parameters 105, shown as $\alpha_1$ TT, $\alpha_2$ TT . . . , represent parameters associated with a typically nominal target-manufactured CMOS device having predetermined attributes and assuming minimum process variations. Parameters 103, shown as $\alpha_1$ FF, $\alpha_2$ FF, . . . , represent parameters associated with a CMOS device which is manufactured under process conditions which result in a CMOS device which operates at switching speed extremes. In other words, the CMOS device attributes are manufactured under conditions which create a fast NMOS device and fast PMOS device. Parameters 103 are derived from parameter 105. Parameters 104, shown as $\alpha_1$ FS, $\alpha_2$ FS . . . , illustrate parameters associated with a CMOS device where the NMOS device is manufactured under process conditions which enable maximum switching speeds while the PMOS device operates at minimum operating switching speeds. Parameters 104 are also derived from parameter 105. Likewise, parameters 106, shown as $\alpha_1$ SF, $\alpha_2$ SF . . . , refer to a manufactured CMOS device in which the NMOS device operates at a minimum switching speed and the PMOS device is manufactured under conditions which enable operations at a maximum switching speed. Finally, parameters 107, shown as $\alpha_1$ SS, $\alpha_2$ SS . . . , refer to a manufactured CMOS device in which both the NMOS device and PMOS device are manufactured under conditions which create minimum switching speeds for both devices. These five process parameters 103–107 are also referred to as the "five corners" or illustrate the operational or behavioral envelope for a typical manufactured CMOS device. The five corners are shown by reference numeral 110. Based on these measured and derived parameters 103–107, designers can model, with a semiconductor simulator 108, the IN curve 109 of a semiconductor device. In particular, the designer can determine worst-case I/V curves 109a–b and how worst case transistors affect a circuit.

The prior art method described above suffers from many disadvantages in accurately modeling a transistor. First, because the parameters 103–107 do not accurately reflect mass-produced semiconductor devices under typical process conditions, the I/V curve 109 and five corners 110 do not reflect realistic worst-case I/V curves and device operating envelopes, respectively. Specifically, parameter 103, representing a fast PMOS device and fast NMOS device, does not accurately represent a mass-produced CMOS semiconductor device. For example, the doping concentrations necessary to create a CMOS semiconductor device corresponding to these parameters would rarely, if at all, be encountered in a mass production line. Likewise, parameters 107 do not accurately reflect the worst-case slow NMOS device and slow PMOS device typically manufactured in a production line. Thus, the I/V curves 109a–b and five corners 110 do not accurately represent the worst-case semiconductor devices manufactured on a typical mass-production line. A designer is typically factoring in unnecessary manufacturing tolerances, or bands, in designing a semiconductor device based upon exaggerated worst-case curves. Unnecessary spacing may be designed into semiconductor components, creating slower and larger devices than could otherwise be manufactured. Thus, such conventional techniques may result in "over-designing" such semiconductor devices.

Second, prior methods of modeling semiconductor devices do not use semiconductor manufacturing process simulations generating distributions of manufactured semiconductor devices, thereby improving the accuracy of a semiconductor simulator. Specifically, conventional methods use parameters derived from a single or few semiconductor devices. These parameters do not accurately reflect the substantial variations in semiconductor manufacturing process steps and how these variations affect a mass-produced semiconductor device behavior. For example, the prior method does not consider how manufacturing variations in forming oxidation layers or channel lengths affect modeled semiconductor devices.

Third, the prior method generally does not improve as further information regarding the manufacturing of the mass-produced semiconductor device is obtained. Specifically, only a relatively small number of values in parameters 105 are measured and used to derive parameters 103, 104, 106 and 107. Thus, greater information regarding the semiconductor device manufacturing process does not improve semiconductor simulation results. The prior method does not generate an improved semiconductor device model if improved information regarding the distribution of mass-produced semiconductor devices from a modeled production line is known. In this sense, the prior method is not adaptive.

Thus, there is a need in the art for a parameter extraction apparatus, method, and system which take into account intra-field variations in order to obtain more realistic worst case curves. In addition, it would be desirable to have such a parameter extraction apparatus, method, and system be able to extract parameters even for a new generation technology where empirical data is not readily available.

SUMMARY OF THE INVENTION

The present invention provides for more realistic worst case extreme determinations for an integrated circuit as compared to conventional techniques. In particular, the present invention provides a framework which affords for improved linkage between semiconductor manufacturing process parameters and an integrated circuit design based on the electrical properties of cells making up the integrated circuit. Conventional techniques for determining worst case extremes of the integrated circuits are unrealistic oftentimes because the individual worst case design parameters employed are aggregated such that a compounding effect results wherein the determined extremes are too pessimistic and unrealistic. In other words, conventional techniques do not take into consideration the negative or cancellative effects of intra-field variations associated with combining various parameter information to obtain more realistic worst case extremes as in the present invention. As a result of the present invention, IC circuits may be manufactured with more realistic or practical worst case extreme parameters and thus, more densely designed and manufactured without substantially sacrificing operability.

According to one aspect of the present invention, a method is provided for facilitating designing an integrated circuit. The method comprises the steps of propagating process parameter data relating to manufacturing the integrated circuit; dividing up the integrated circuit into simple standard cells and complex cells; modeling the simple standard cells as circuits and determining attributes of the simple standard cells; determining I/V curves for the complex cells; and determining worst case design parameters for the integrated circuit using the attributes of the simple standard cells and the I/V curves of the complex cells. The attributes for the simple standard cells may be gate delays and power consumption.

According to another aspect of the present invention, a system for facilitating designing an integrated circuit is disclosed. The system includes a process simulator for propagating process parameter data relating to manufacturing the integrated circuit; a device simulator operatively coupled to the process simulator for dividing up the integrated circuit into simple standard cells and complex cells; and a statistical analyzer operatively coupled to the device simulator for determining at least one worst case design parameter for the integrated circuit using attributes of the simple standard cells and I/V curves for the complex cells. The device simulator models the simple standard cells as circuits, determines the attributes of the simple standard cells, and determines the I/V curves for the complex cells.

According to another aspect of the present invention, actual raw statistical process control (SPC) data is physically collected from a fab or new process parameters are anticipated. Simulators (e.g., Pisces or Supreme) are used to propagate the SPC data. The propagated SPC data are processed to obtain normalized distributions of the electrical properties. A plurality of semiconductor physical attributes are then determined based on the plurality of simulated semiconductor attributes.

In a preferred embodiment, the integrated circuit is divided into simple standard cells and more complex cells. For simple standard cells (e.g., XOR, NAND, NOR, inverter), a pre-modeling step is performed to model the simple standard cell as a circuit. With the electrical parameters obtained from the SPC data, differential equations of the simple standard cell circuit are solved in order to obtain gate delay and power consumption distributions related thereto. Such pre-modeling affords for more accurate electrical parameters to be employed to generate the normalized distribution of the integrated circuit which in turn provides for better worst case extremes.

According to another aspect of the present invention, the SPC data facilitates in simplifying differential equations for the complex cells, and I/V curves distributions of the complex cells are determined for understanding the effects of semiconductor device attribute choices, such as channel length, effects of "guard band", or manufacturability of such devices.

According to another aspect of the present invention, a method is provided for designing and modeling an integrated circuit. The method comprises the steps of differentiating simple standard cells from more complex cells, modeling simple standard cells as circuits, determining the gate delays and power consumption for the simple standard cell circuit, and determining the I/V curves for the complex cells, and determining worst case extremes for the simple standard cells and the complex cells. Power consumption is defined as a sum of power consumed for driving the load, short-circuit switching, and off-state leakage. In addition, gate delay, power consumption, and I/V curves distributions are determined for different electrical parameters.

In accordance with the yet another aspect of the present invention, a design apparatus for modeling a mass-produced semiconductor device is disclosed. A display for displaying data to a user and input means for supplying input data in response to a user's input is provided. Memory for storing a computer software program is coupled to the display and input means. A processor, the input means and the memory are coupled to the display for controlling memory and performing processing operations. The stored software program includes means for providing a plurality of simulated mass-produced semiconductor devices responsive to a plurality of process parameters, wherein the plurality of simulated semiconductor devices have associated attributes. The stored software program also includes means for differentiating simple standard cells from complex cells and providing a plurality of semiconductor device behaviors responsive to the plurality of simulated mass-produced semiconductor devices, and means for obtaining a worst-case semiconductor device behavior responsive to the plurality of semiconductor behaviors.

One specific embodiment of the present invention provides for a method for facilitating designing an integrated circuit. According to the method, process parameter data relating to manufacturing the integrated circuit are propagated. The integrated circuit is divided into at least one simple standard cell and at least one complex cell. The at least one simple standard cell is modeled as a circuit, and at least one attribute of the at least one simple standard cell is determined. A drain-to-source current and drain-to-source voltage relationship for the at least one complex cell is determined. At least one worst case design parameter for the integrated circuit using the at least one attribute of the simple standard cell and the at least one drain-to-source current and drain-to-source voltage relationship is determined.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
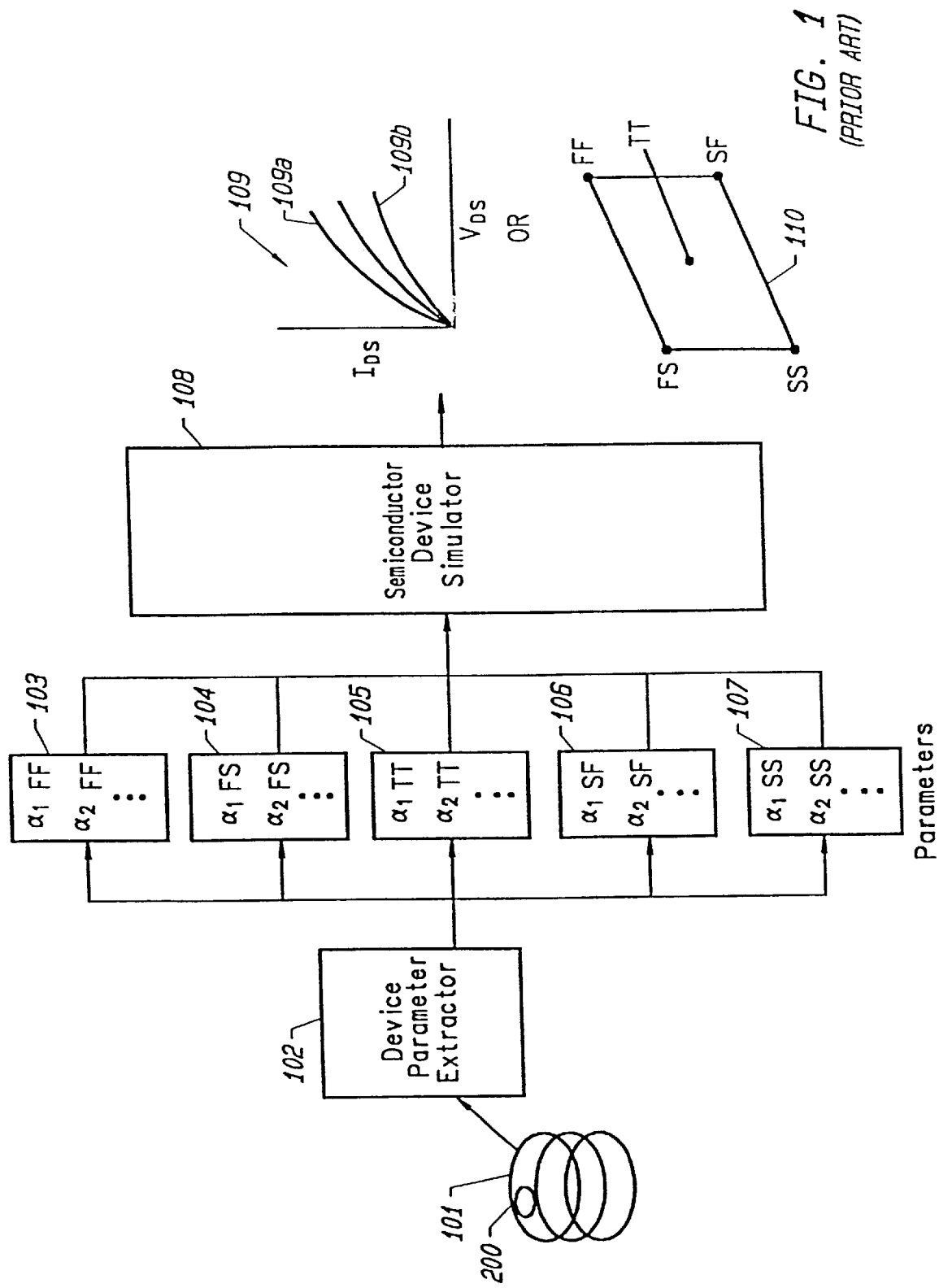
FIG. 1 illustrates a prior method for modeling semiconductor behavior for a specified semiconductor device.
Figure 2:
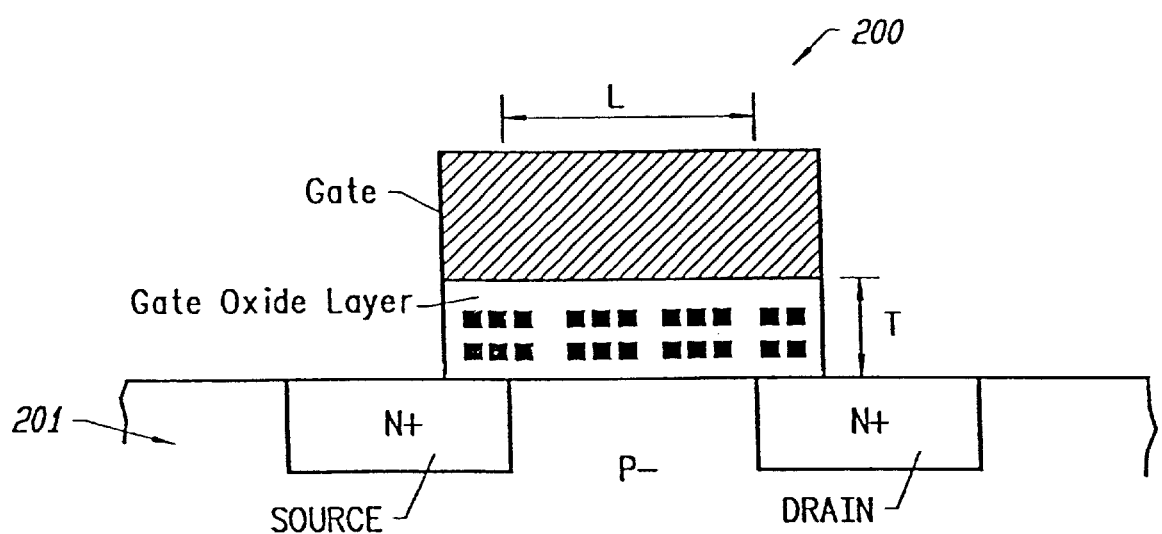
FIG. 2 illustrates a typical NMOS semiconductor device.

The present invention will now be described with reference to the drawings wherein like reference numerals are used to refer to like elements throughout. As mentioned above, the present invention provides for obtaining worst case distributions for an integrated circuit that are more realistic than worst case parameters obtained via conventional techniques. In the exemplary embodiment described hereinafter, integrated circuits are divided into two types of cells: simple standard cells and complex cells. Simple standard cells may include cells with less than 20 gates (e.g., XOR, NAND, NOR, inverter), or cells which are essential for the design of an integrated circuit. Complex cells are multiplexers, adders, analog circuits, sense amplifiers, etc. A pre-modeling step is performed for simple standard cells (e.g., XOR, NAND, NOR, inverter) in order to obtain gate delay and power consumption distributions. Such pre-modeling step affords for more accurate parameter data to be employed in generating normalized distributions for an integrated circuit which in turn provides for obtaining practical worst case distributions. For complex cells, varying parameters are extracted from I/V curves in order to provide for good worst case distribution results.

Figure 3:
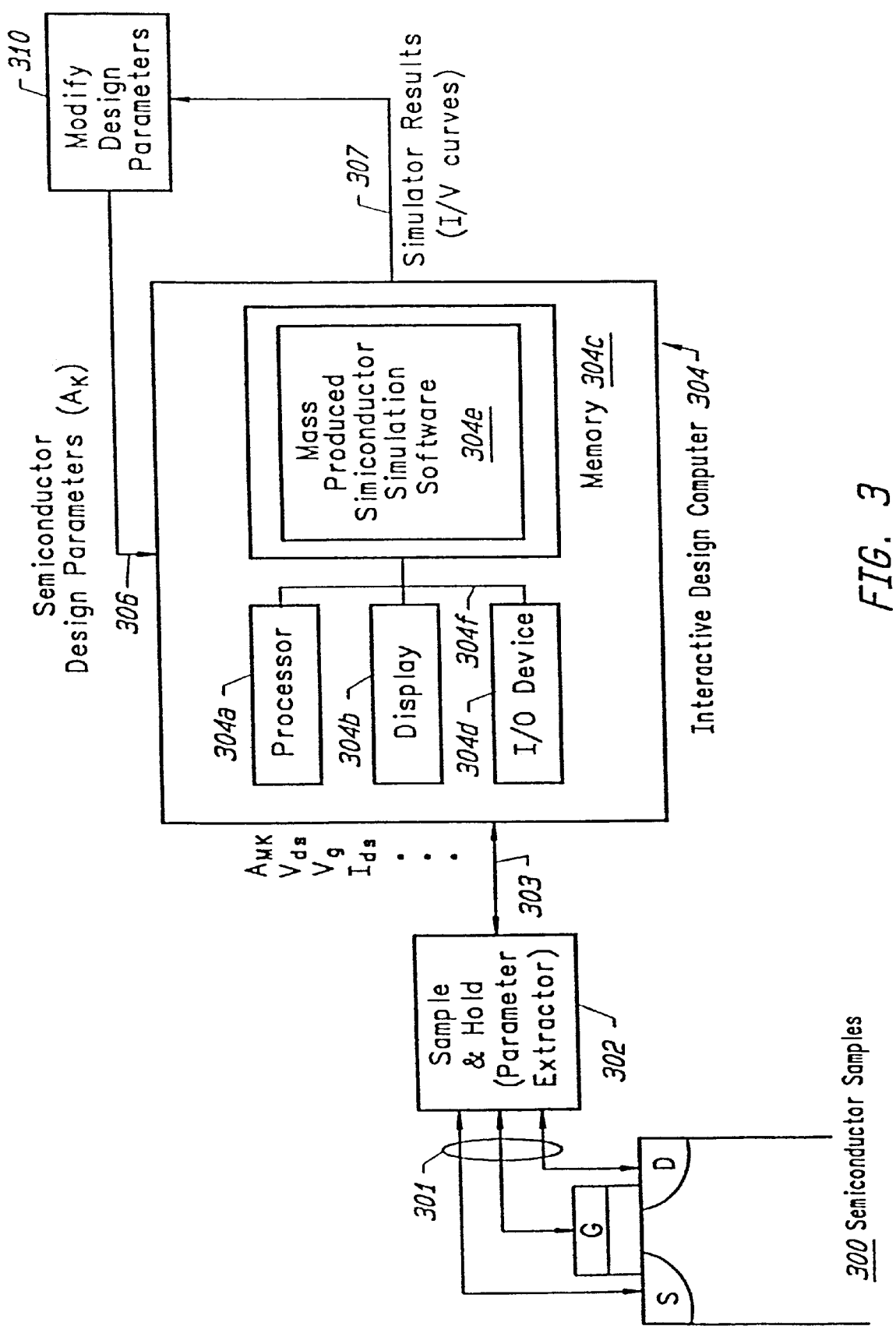
FIG. 3 illustrates an apparatus, such as an interactive design computer, for modeling semiconductor behavior for a specified mass-produced semiconductor device in accordance with the present invention.

Referring initially to FIG. 3, an interactive design apparatus for designing circuits in view of discovered physical attributes (or gate delay and power consumption for simple standard cells and I/V curves for complex cells) of simulated mass-produced semiconductors is illustrated. Electrical attributes of a semiconductor device such as channel length, effects of "guard band", or manufacturability of such semiconductor device are obtained from semiconductor device samples 300 via leads 301 which are connected to sample & hold device 302. Tables A, B, and C below provide a sample list of the attributes which sample & hold device 302 may obtain from the semiconductor samples 300. In an exemplary embodiment, sample & hold device 302 may include a parameter extractor. The parameter extractor may include a computer and signal analyzer connected to a probe station for measuring signals from the semiconductor device samples 300. The computer may also include parameter extractor software. In an alternate embodiment, the sample & hold device 302 may be incorporated into an interactive design computer 304. The signal values obtained from the sample & hold device 302 then may be transferred on bus 303 to the interactive design computer 304. Signal values transferred on the bus 303 may be entered manually into the computer 304. Semiconductor attributes $A_{MK}$, such as channel length, gate oxide thickness, doping concentration and so on may also be entered manually or transferred on bus 303. Design computer 304 may also control the sampling of current and voltage values by the sample & hold device 302 by sending command signals on bus 303.

In an exemplary embodiment, design computer 304 includes processor 304a, display 304b, I/O device 304d and memory 304c. Processor 304a, display 304b and I/O device 304d are coupled by internal bus 304f. Memory 304c may include mass-produced semiconductor simulation software program 304e. While FIG. 3 illustrates the design computer 304c employing a single processor, it should be understood that the present invention could be used in a multiple or distributed processor environment. Generally, processor 304a interacts with mass-produced semiconductor simulation software 304e in memory 304c to display I/V curves on display 304b in response to voltage and current values transmitted over bus 303, as well as semiconductor design attribute values $A_K$ (channel length, doping concentration and so on). I/O device 304*d*, such as a mouse, glide pad and/or keyboard, may be used to input data and selections to the design computer 304.

The design computer 304 may output gate delay, power consumption, I/V curves and/or simulation semiconductor physical attributes via line 307. These results may be output to another computer/network or displayed on display 304*b*. Semiconductor device attributes $A_K$ then may be modified based upon the simulation results, as illustrated by logic block 310. In a preferred embodiment, a user may modify semiconductor attributes by inputting new design attributes $A_K$, by way of I/O device 304*d*, into interactive design computer 304, as illustrated by arrow 306. Based upon the simulation results, a user may analyze the various worst-case extremes in a mass-produced semiconductor device based upon the specific design attributes $A_K$. Moreover, a user may adjust certain design attributes in order to meet manufacturing tolerance guards or design specifications.

Figure 4A:
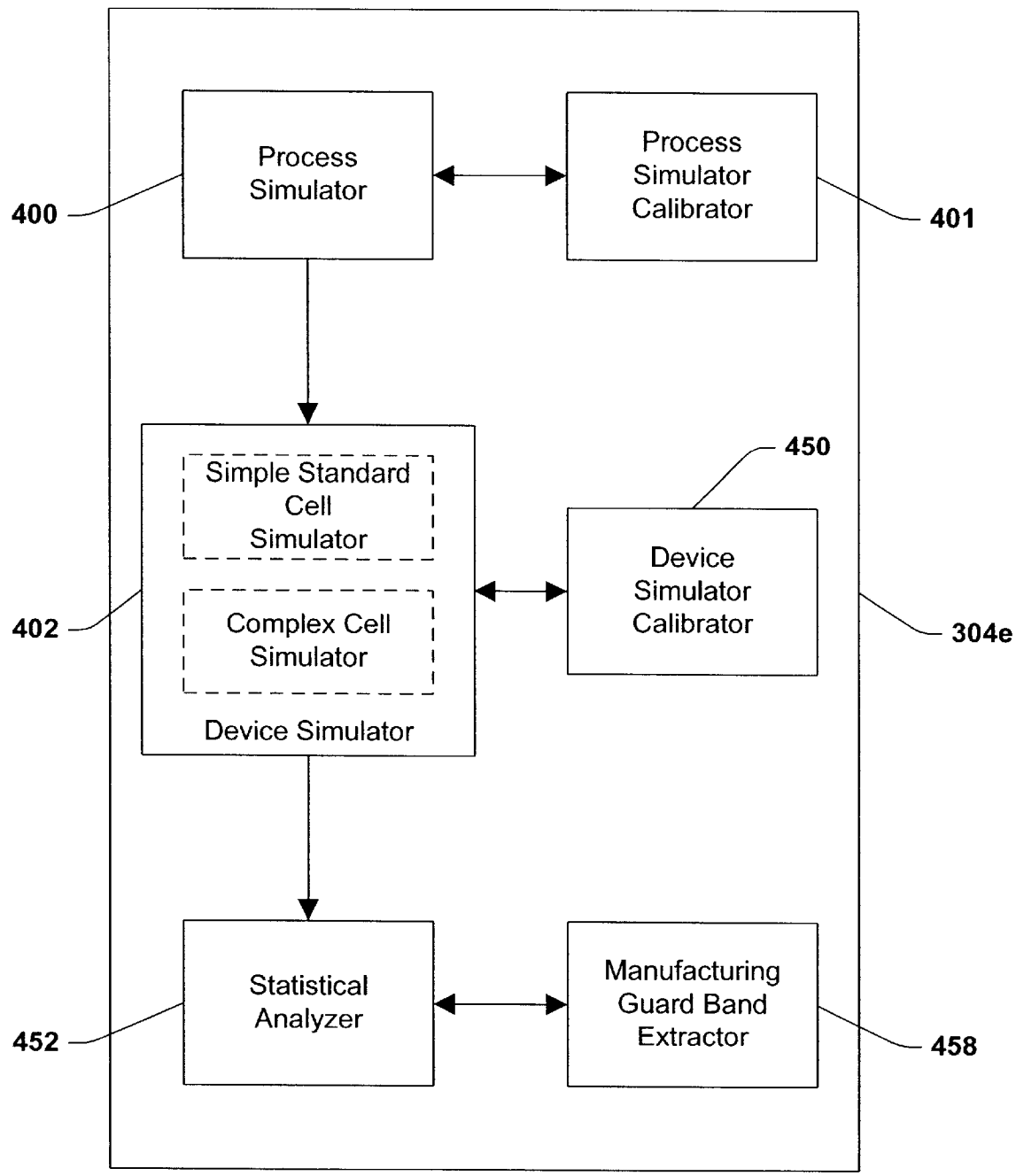
FIG. 4a illustrates software modules of mass-produced semiconductor simulation software employed by the design computer of FIG. 3.

FIG. 4*a* illustrates the software modules used in the mass-produced semiconductor simulation software 304*e* (FIG. 3). Among the various software modules, mass-produced semiconductor simulation software 304*e* includes a process simulator 400 for simulating the manufacture of multiple semiconductor devices based on process parameter inputs. For example, process simulator 400 identifies process steps contributing to circuit design variations and outputs various simulated semiconductor devices having different attributes, such as varying doping concentrations, channel lengths, gate oxide thicknesses, junction depths, etc., depending upon inputted process parameters. An example of a process simulator is a T-Suprem IV™ simulator, available from Avant! of Fremont, Calif.

The process simulator 400 also contains actual raw SPC data physically collected from a fab or alternatively anticipated SPC parameters. The process simulator 400 propagates the SPC data in order to obtain normalized distributions of the electrical properties collected by the sample & hold device 302 (in FIG. 3). Once the SPC data is propagated, a plurality of semiconductor physical attributes such as gate delay, power consumption, and I/V curves may then be determined.

Referring back to FIG. 4*a*, a process simulator calibrator 401 calibrates process simulator 400 results based upon actual semiconductor device attribute measurements $A_{MK}$ from a sampled semiconductor manufactured on a production line, for example. Process simulator calibrators 401 are known in the art, and thus further discussion related thereto is omitted for sake of brevity.

A device simulator 402 outputs semiconductor device behaviors based upon inputted semiconductor device attributes, such as channel length, doping concentration, gate oxide thickness, and so on. According to one aspect of the present invention, an integrated circuit ("IC") is divided into simple standard cells (e.g., XOR, NAND, NOR, and inverter), and more complex cells. As mentioned above, simple standard cells may include cells with less than 20 gates (e.g., XOR, NAND, NOR, and inverter), or cells which are essential for the design of an integrated circuit. Complex cells include multiplexers, adders, analog circuits, or sense amplifiers. Simple standard cells are modeled as circuits. With the propagated SPC data from the process simulator 400, differential equations of the simple standard cells circuits are then solved in order to determine gate delays and power consumptions.

For complex cells, I/V curves for n- and p-channel transistors are first obtained. The propagated SPC data from the process simulator 400 simplifies the differential equations of the complex cells thus facilitating determination of the I/V curves. The degree of influence of particular device attributes (e.g. channel lengths, doping concentrations, gate oxide thicknesses, junction depths) are manifested in the I/V curves, respectively. Accordingly, the impact of a particular device attribute on worst case extreme parameters of the semiconductor device can be determined as discussed below.

Figure 4B:
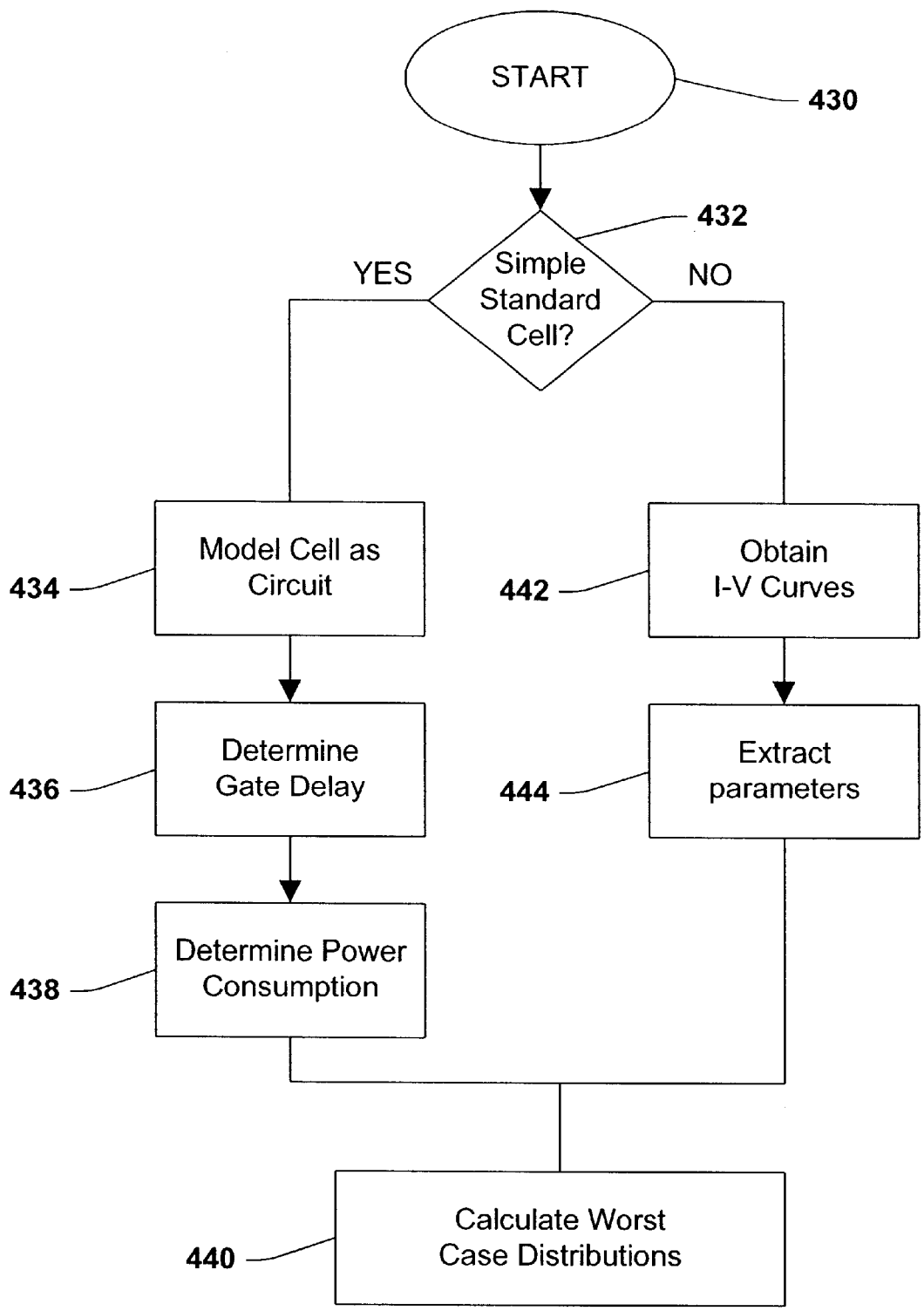
FIG. 4b is a flowchart of operations of a device simulator designed in accordance with the present invention.

Turning briefly to FIG. 4*b*, a flowchart is shown describing device simulator 402 operations for extracting device parameters from the cells for worst case distribution determinations. In particular, the flowchart illustrates device simulator 402 operations of differentiating between simple standard cells and complex cells, and of extracting device parameters from the respective cells for worst case distribution determinations. In step 430, a device simulator 402 designed in accordance with the present invention is accessed. The device simulator 402 may be accessed by default at start up of the mass-produced semiconductor simulation software 304*e*, by a triggering event such as a manual command from I/O devices 304*d*, and/or routinely within the interactive design computer 304. Implementation of such a system will be readily apparent to one skilled in the art.

Figure 4C:
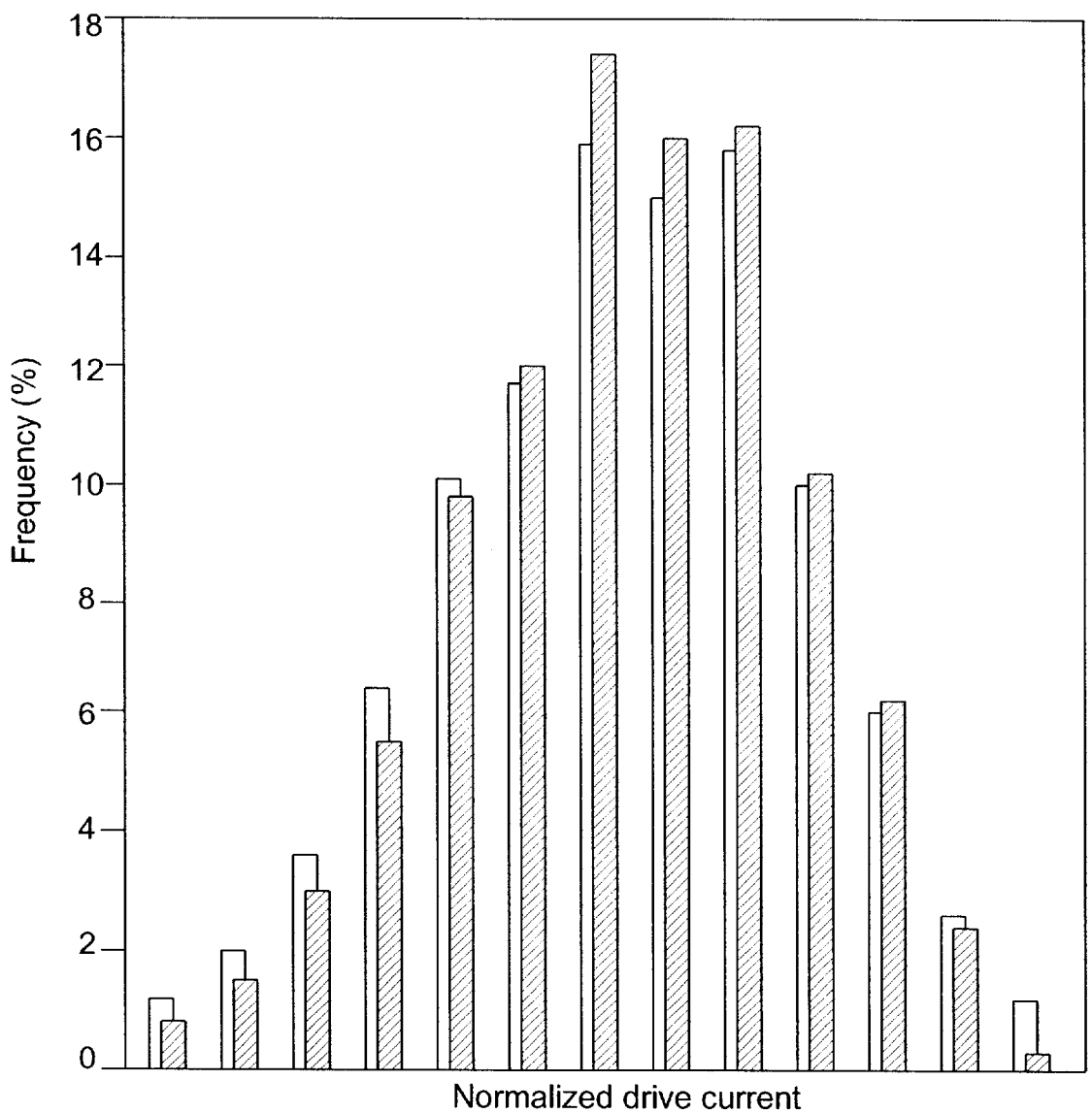
FIG. 4c illustrates histograms for n-channel drive currents obtained from a circuit designed in accordance with one aspect of the present invention.
Figure 4D:
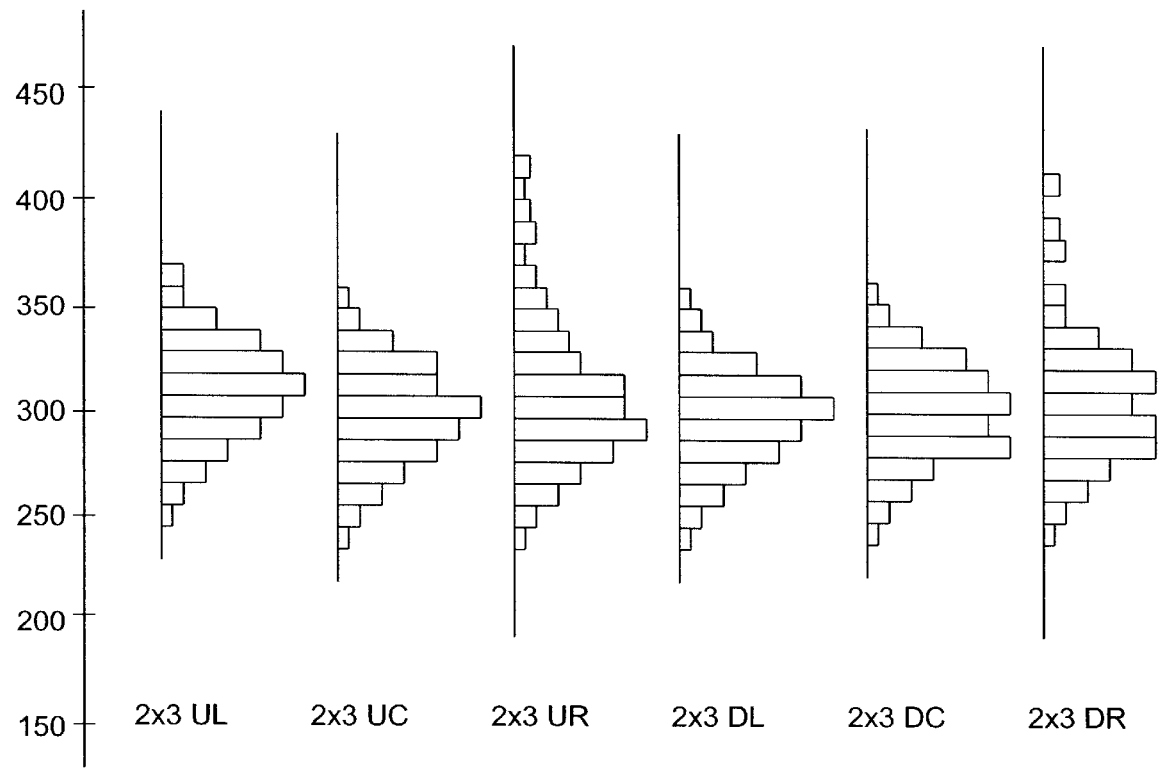
FIGS. 4d–f illustrate results of complex cell modeling in accordance with one aspect of the present invention.
Figure 4E:
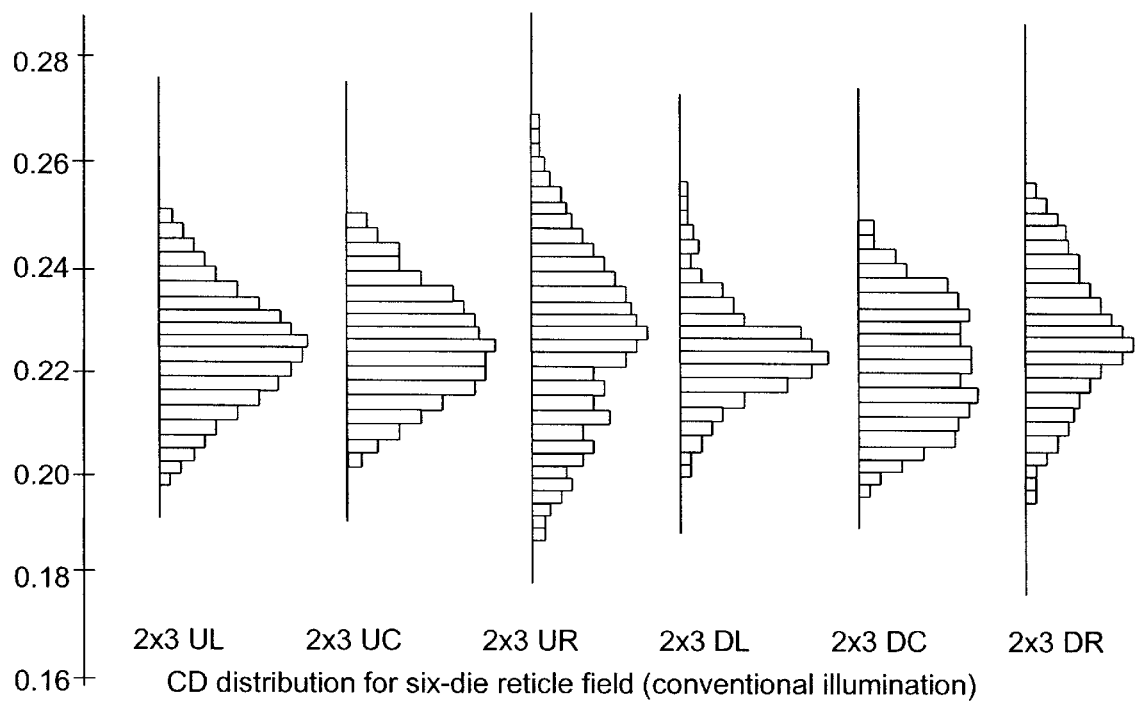
Figure 4F:
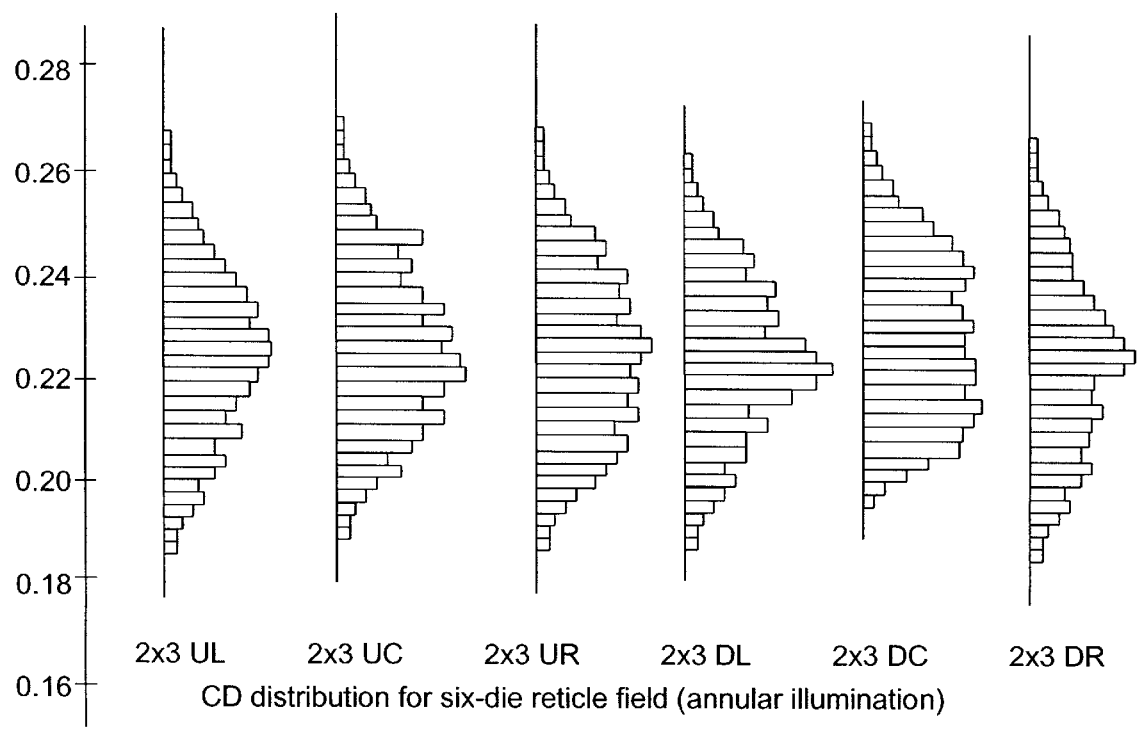
Figure 4G:
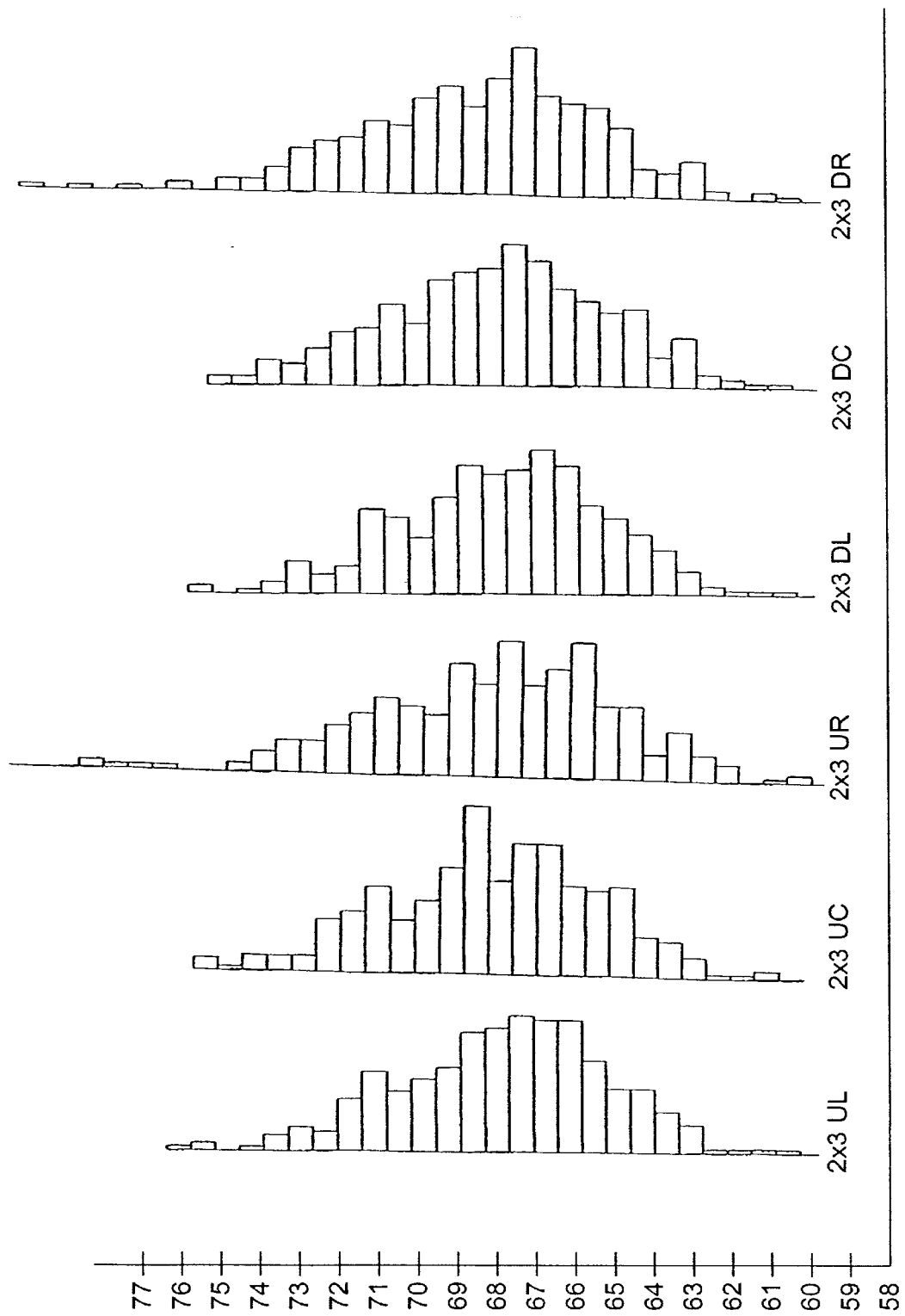
FIGS. 4g–i illustrate results of simple standard cell modeling in accordance with one aspect of the present invention.
Figure 4H:
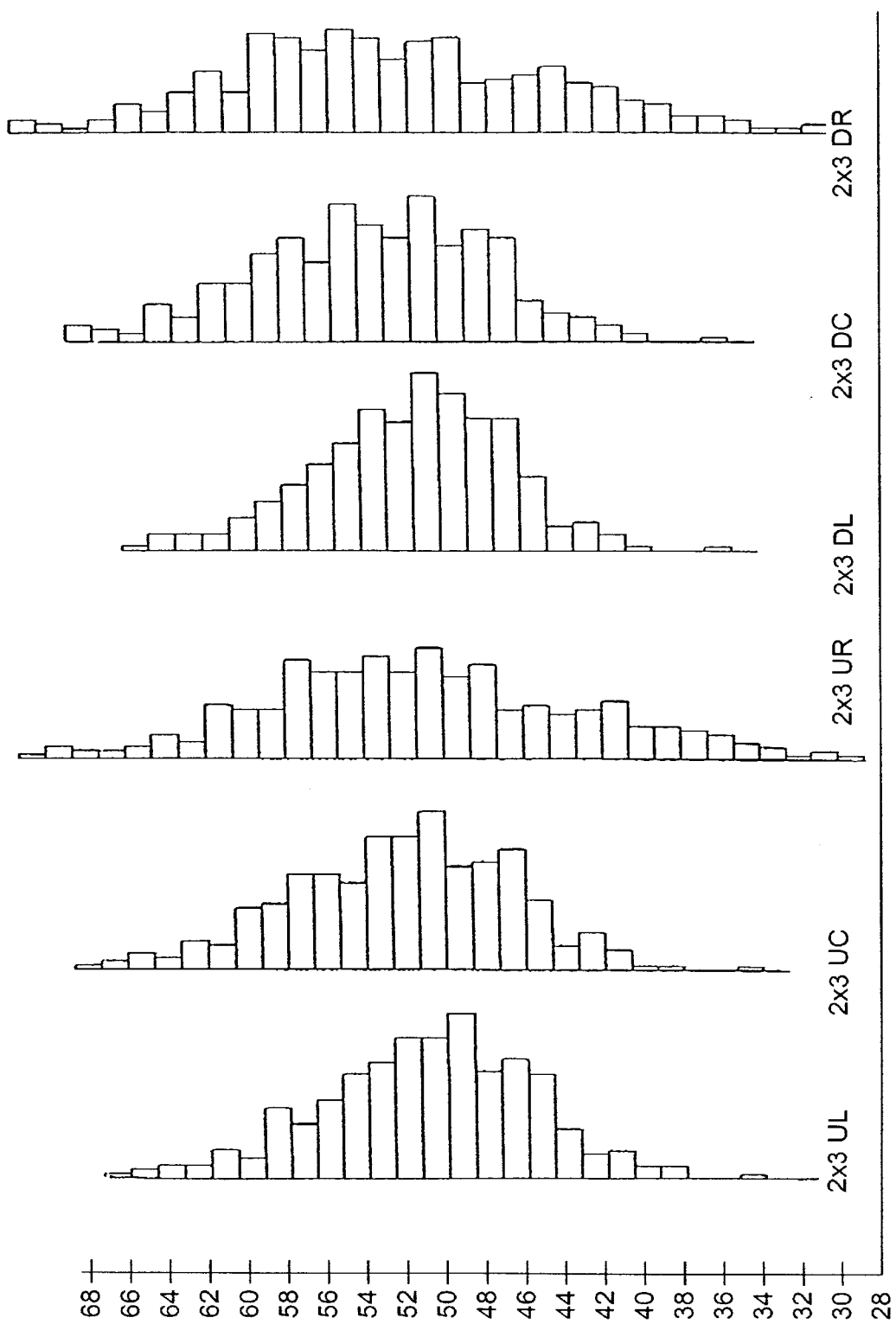
Figure 4I:
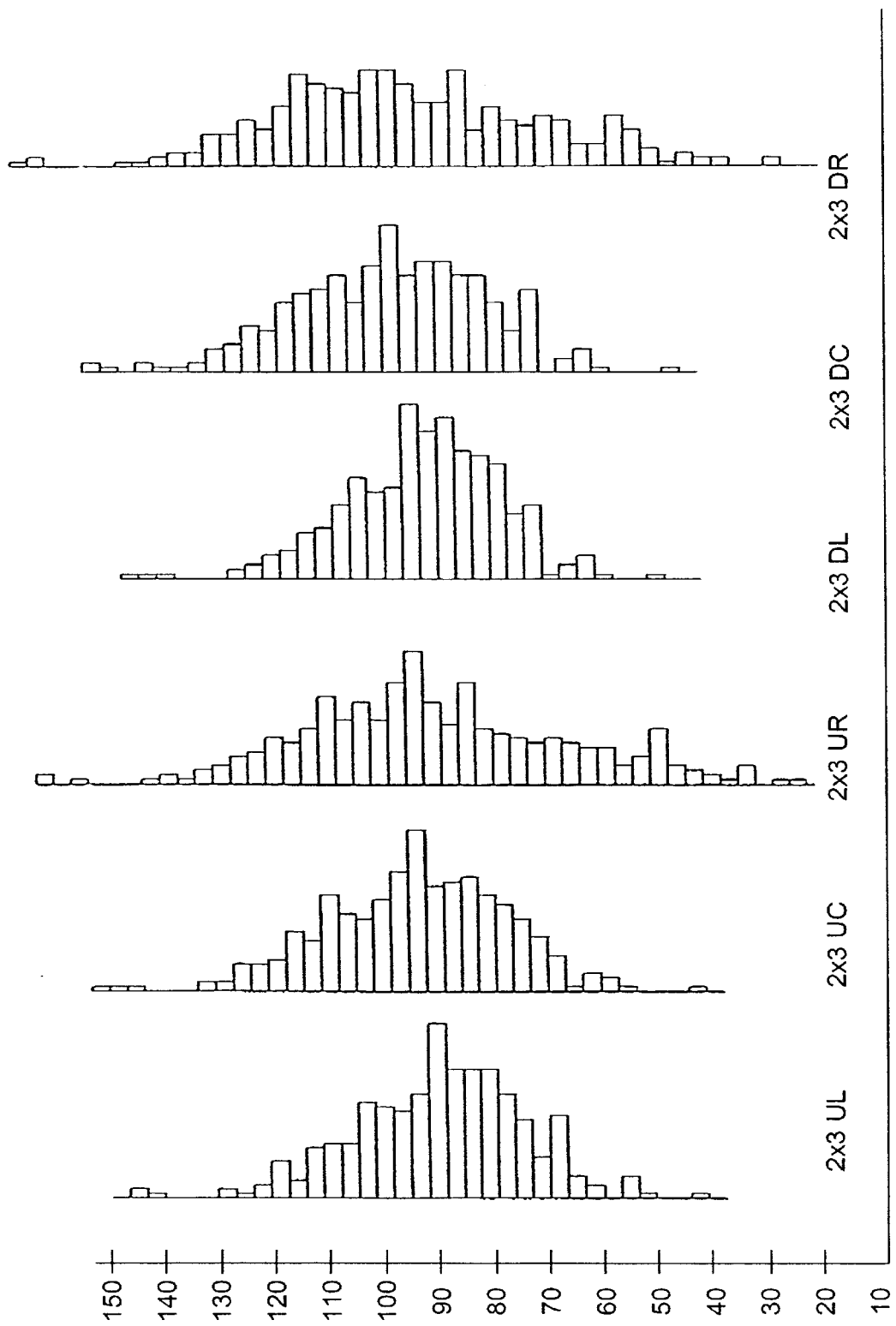

In step 432, the device simulator 402 determines if the cell being analyzed is a simple standard cell or a more complex cell. As mentioned above, an IC can be divided into simple standard cells including cells with less than 20 gates (e.g. XOR, NAND, NOR, inverter) or cells essential for the design of an integrated circuit, and more complex cells including multiplexers, adders, analog circuits, or sense amplifiers. As illustrated by FIGS. 4*g–i,* due to the relative simplistic structure of a simple standard cell, such a cell may be modeled without going through the steps of obtaining I/V curves and extracting varying parameters from such curves. Differential equations of the simple standard cell could be more easily solved, and varying parameters for worst case distribution calculations can be determined by calculating the gate delay and power consumption for the simple standard cell.

If a simple standard cell is found, the device simulator 402 proceeds to step 434 and models the simple standard cell as a circuit. Then, the device simulator 402 solves the differential equation for the simple standard cell circuit, and determines gate delay and power consumption of the cell in steps 436 and 438. Once the gate delay and power consumption are found for a simple standard cell circuit, realistic worst case distributions can be calculated in step 440.

If in step 432 a complex cell is found, more complicated steps need to be followed in order to extract varying parameters for worst case distribution calculation. The device simulator 402 proceeds to step 442 where I/V curves for the complex cell are determined. As mentioned above, the propagated SPC data from the process simulator 400 simplifies the differential equations of the complex cells thus facilitating determination of the I/V curves. Since the degree of influence of particular device attributes (e.g., channel lengths, doping concentrations, gate oxide thicknesses, junction depths, etc.) are manifested in the I/V curves, parameters may then be extracted in step 444 for the worst case distributions to be determined in step 440.

An example of a complex cell device simulator is a BSIM3 device simulator, available from the Department of Electrical Engineering and Computer Science, University of California, Berkeley, Calif. 94770. In the BSIM3 device simulator, simulator parameters are input into the device simulator. These parameters are divided into several categories. The first set of parameters, as illustrated by Table A, are obtained from measured semiconductor devices. The second set of parameters, as illustrated by Table B, are temperature effect parameters which are also extracted from measured semiconductor devices. Finally, elementary parameters and model flags, as illustrated in Table C, are input into the BSIM3 simulator, and are not obtained from measured semiconductor devices. As can be seen from the tables, default values may be entered if data is not available.

TABLE A

Drain Current Model Parameters Extracted from Measured Data

| Parameter | Description | Default | Unit |
|---|---|---|---|
| vth0 | Threshold voltage @ $V_{bs}$ - 0 for large L | * | V |
| k1 | First-order body effect coefficient | * | V 1/2 |
| k2 | Second-order body effect coefficient | * | — |
| k3 | Narrow width coefficient | 80.0 | — |
| w0 | Narrow width parameter | 2.5E-6 | m |
| n1x | Lateral non-uniform doping coefficient | 1.74E-7 | m |
| dvt0 | First coefficient of short-channel effect on $V_{th}$ | 2.2 | — |
| dvt1 | Second coeff. of short-channel effect on $V_{th}$ | 0.53 | — |
| dvt2 | Body-bias coeff. of short-channel effect on $V_{th}$ | -0.032 | 1/V |
| dl | channel-length reduction on one side | 0 | m |
| dw | channel width reduction on one side | 0 | m |
| ua | First-order mobility degradation coeff. | 2.25E-9 | m/V |
| ub | Second-order mobility degradation coeff. | 5.87E-19 | $(m/V)^2$ |
| uc | Body-effect of mobility degradation coeff. | 0.0465 | 1/V |
| vsat | Saturation velocity at Temp = Tnom | 8.0E6 | cm/sec |
| a0 | Bulk charge effect coefficient | | |
| | NMOS | 1.0 | |
| | PMOS | 4.4 | |
| keta | Body-bias coeff. of the bulk charge effect | -0.07 | 1/V |
| a1 | First non-saturation factor | | |
| | NMOS | 0 | 1/V |
| | PMOS | 0.23 | |
| a2 | Second non-saturation factor | | |
| | NMOS | 1.0 | — |
| | PMOS | 0.08 | |
| rds0 | Contact resistance | 0 | Ω |
| rdsw | Parasitic resistance per unit width | 0 | Ω.μm |
| voff | Offset voltage in the subthreshold region | -0.11 | V |
| nfactor | Subthreshold swing coeff. | 1.0 | — |
| cdsc | Drain/Source and channel coupling cap. | 2.4E-4 | $F/m^2$ |
| eta0 | DIBL coefficient in subthreshold region | 0.08 | — |
| etab | Body-bias coeff. for the subthreshold DIBL effect | -0.07 | 1/V |
| dsub | DIBL coefficient in subthreshold region | drout | — |
| pclm | Channel length modulation coeff. | 1.3 | — |
| pdibl1 | First output resistance DIBL effect coeff. | 0.39 | — |
| pdibl2 | Second output resistance DIBL effect coeff. | 0.0086 | — |
| drout | L depend. coeff. of the DIBL effect in $R_{out}$ | 0.56 | — |
| pscbe1 | First substrate current body-effect coeff. | 4.24E8 | V/m |
| pscbe2 | Second substrate current body-effect coeff. | 1.0E-5 | V/m |

TABLE B

Temperature Effect Coefficients

| Parameter | Description | Default | Unit |
|---|---|---|---|
| Tnom | Temp. at which parameters are extracted | 27 | ° C. |
| ute | Mobility temperature exponent | -1.5 | — |
| kt1 | Temperature coeff. for threshold voltage | -0.11 | V |
| kt11 | Channel length sensitivity of temperature coeff. for threshold voltage | 0 | Vm |
| kt2 | Body-bias coeff. of the $V_{th}$ temperature effect | 0.022 | — |
| ua1 | Temperature coeff. for ua | 4.31E-9 | m/V |
| ub1 | Temperature coeff. for ub | -7.61E-18 | $(m/V)^2$ |
| uc1 | Temperature coeff. for uc | -0.056 | 1/V |
| uc() | Temperature coeff. | * | $(V/m)^2$ |
| at | Temperature coeff. for saturation velocity | 3.3E4 | m/sec |

TABLE C

Elementary Parameters

| Parameter | Description | Default | Unit |
|---|---|---|---|
| tox | Gate oxide thickness | 1.50E-8 | m |
| xj | Junction Depth | 1.50E-7 | m |
| npeak | Peak doping concentration near the interface | 1.7E17 | $1/cm^3$ |
| nsub | Substrate doping concentration | 6.0E16 | $1/cm^3$ |
| subthMod | Subthreshold model selector | 2 | — |
| satMod | Saturation model selector | 2 | — |
| bulkMod | Bulk charge model selector | 1 | — |
| xpart | Charge partitioning flag | 1 | — |

In an exemplary study conducted in accordance with the present invention, the control of focus, exposure dose, and post-exposure bake (PEB) temperature were found to influence critical dimension ("CD") control. Process steps, including channel length, gate oxide thickness, spacer width control, and control of the RTA temperature, have been found to be significant in determining a circuit's manufacturability. In addition, variations in focus, exposure dose, PEB, temperature control, development time, photoresist thickness, thickness of bottom antireflective layer, deposited plasma power and overetch time are considered to affect these process steps. FIG. 4c validates these assumptions and the uses of process and device simulators 400 and 402, and illustrates histograms for n-channel drive currents obtained in accordance with one aspect of the present invention.

In FIG. 4c, results of a 125-run of orthogonal array design and kriging interpolators are conducted in accordance with the present invention. Drive currents are normalized to the mean value of empirical data. Then, distributions of drive currents for both n- and p-channel nominal devices are compared to those obtained by the SPC. As FIG. 4c illustrates, mean values differ only 3% and are in good agreement. On the other hand, although empirical distributions differ broader by 10%, such difference is attributed to assumption made for spacer widths due to lack of empirical distributions. As a result, the assumptions of CD control influences and critical process steps are valid for more complex cells as can be seen by the correlation of experimental data to simulated data in FIG. 4c.

The study was conducted assuming six dice and 25 sites in a reticle field and with the following settings: (1) two stepper settings with APEX-E resist and PEB temperature of 100° C., and nominal gate length of 200 nm: (a) a conventional illumination case with N.A. of 0.57, partial coherence of 0.6, and photoresist thickness of 0.75 um, and (b) an annular illumination case with N.A. of 0.57, outer ring partial coherence of 0.65, inner ring partial coherence of 0.35, and photoresist thickness of 0.71 um; and (2) orthogonal array design and Latin Hypercube Gaussian sampling for statistical simulation. FIGS. 4d–f illustrate that the experimental data obtained in accordance with the present invention is a close proximate of the simulated data.

As FIGS. 4d–f illustrate, there are similar patterns for the distribution of drive currents for all six dice for complex cells. The gate CD control is the dominant contributor to variations with 89%, followed by RTA 5%, and gate oxide control with 4%. In other words, the device characteristics considered in the aforementioned exemplary study mirror the CD distributions very well when constructed under the above settings. FIGS. 4d–f are obtained from the results of the 6-dice reticles are illustrated in Table D.

TABLE D

| Die  | CD    | $I_{dsn, mean}$ | $I_{dsn, st\_dev}$ | $I_{dsp, mean}$ | $I_{dep, st-dev}$ |
|------|-------|-----------------|--------------------|-----------------|-------------------|
| A-UL | 0.985 | 1.024 | 1.566 | 1.042 | 1.698 |
| A-UC | 1.105 | 0.946 | 1.718 | 0.989 | 1.662 |
| A-UR | 1.011 | 0.983 | 1.589 | 0.995 | 1.634 |
| A-DL | 0.986 | 1.022 | 1.45  | 1.036 | 1.565 |
| A-DC | 1.033 | 0.946 | 1.689 | 0.958 | 1.62  |
| A-DR | 1.039 | 0.936 | 1.638 | 0.947 | 1.609 |
| C-UL | 0.997 | 1.005 | 0.844 | 1.003 | 0.823 |
| C-UC | 1.007 | 0.988 | 0.889 | 0.985 | 0.835 |
| C-UR | 0.994 | 1.009 | 1.317 | 1.019 | 1.408 |
| C-DL | 1.0   | 1.0   | 0.758 | 0.997 | 0.733 |
| C-DC | 1.015 | 0.976 | 0.928 | 0.973 | 0.845 |
| C-DR | 1.004 | 0.994 | 1.303 | 1.0   | 1.332 |

For simple standard cells, a 4-input NAND is modeled with $R_L=20$ fF, clock speed of 300 Mhz, and rise and fall times of 100 ps. Power consumption in the study is defined as a sum of power consumed for driving the load, short-circuit switching, and off-state leakage. Table E illustrates the results of an exemplary 4-input NAND study generated by a simple standard cell simulator 402 in FIG. 4a.

TABLE E

| Die  | $T_{rise, mean}$ | $T_{rise, st\_dev}$ | $T_{fall, mean}$ | $T_{fall, st\_dev}$ | $P_{mean}$ | $P_{st\_dev}$ |
|------|------------------|---------------------|------------------|---------------------|------------|---------------|
| A-UL | 0.975 | 1.55  | 0.953 | 1.573 | 1.014 | 1.386 |
| A-UC | 1.025 | 1.665 | 1.05  | 1.713 | 1.017 | 1.181 |
| A-UR | 1.018 | 1.578 | 1.037 | 1.595 | 1.017 | 1.298 |
| A-DL | 0.977 | 1.43  | 0.957 | 1.462 | 1.017 | 1.365 |
| A-DC | 1.056 | 1.644 | 1.111 | 1.686 | 1.022 | 1.17  |
| A-DR | 1.066 | 1.623 | 1.13  | 1.642 | 1.023 | 1.299 |
| C-UL | 0.994 | 0.851 | 0.989 | 0.842 | 0.995 | 0.955 |
| C-UC | 1.012 | 0.894 | 1.024 | 0.887 | 0.999 | 0.982 |
| C-UR | 0.99  | 1.298 | 0.981 | 1.321 | 1.009 | 1.133 |
| C-DL | 1.0   | 0.771 | 0.999 | 0.755 | 0.994 | 0.938 |
| C-DC | 1.025 | 0.929 | 1.049 | 0.926 | 1.002 | 1.001 |
| C-DR | 1.006 | 1.286 | 1.012 | 1.306 | 1.099 | 1.082 |

FIGS. 4g–4i are obtained from Table E, and they illustrate the power consumption, and rise and fall time gate delays for a 4-input NAND analyzed in accordance with the present invention. As the figures illustrate, for simple standard cells, a strong correlation exists between gate delay distributions and power consumption distributions and CD distributions (FIG. 4e). In other words, to obtain worst case distributions in FIG. 4b for simple standard cells, modeling simple standard cells (step 434) with gate delay (step 436) and power consumption distributions (step 438) provides more realistic device characteristics.

As FIGS. 4g–4i illustrate, the circuit performance of a 4-input NAND, or a simple standard cell, is less dependent on gate critical dimensions. In other words, gate CD distributions do propagate into circuit parameters but less than for simple n- and p-channel transistors. Instead, variance components for the fall gate delays are: CD control 90%, inner-outer gate bias 5%, RTA control 3%; and for the rise gate delays are CD control 83%, RTA control 10%, spacer width control 3%, and gate oxide thickness 1%. For total power consumption, variance components are different as well: gate length distribution 45%, spacer width 24%, and RTA control 23%. Thus, simple standard cells can be modeled as simple circuits, and parameters for simple standard cells can be derived from the modeled circuits' parameters by solving the differential equations of the circuits.

Referring now back to FIG. 4a, a device simulator calibrator 450, as with the process the simulator calibrator software module 401, calibrates device simulator behavior outputs from device simulator 402 based upon gate delays and power consumption for simple cells such as XOR, NAND, NOR, inverter, etc. or based on measured I/V curves of sampled semiconductor devices for complex cells.

Statistical analyzer 452 is then used to determine worst-case distributions using gate delays and power consumption for simple cells such as XOR, NAND, NOR, inverter, etc. or using the I/V curves associated with the multiple simulated devices output from device simulator 402. In complex cell cases, conditional distributions of current values for a specific voltages are obtained. In a preferred embodiment, orthogonal array-based Latin hypercube sampling (LHS) is used as a statistical technique to sample the input variables (e.g., gate delay and power consumption for simple standard cells and/or I/V curve parameters for complex cells). LHS minimizes, relative to other commonly used sampling schemes such as Monte Carlo, the number of runs required to produce meaningful statistical results. LHS produces a global selection of points which provides an unbiased estimate of mean values and probability distributions of model output.

With Latin Hypercube sampling, first, the range of the variable is divided into several non-overlapping intervals based upon equal probabilities. Then, the values are randomly selected from intervals with respect to the probability density function for that interval. Since LHS forces all intervals to be represented, the entire distribution can be represented by a small sample. In addition, since all possible values with equal probability results are obtained with LHS, results can be more meaningful.

According to another aspect of the present invention, drain-to-source current values are averaged and a standard deviation is obtained for predetermined drain-to-source voltage values. In another embodiment, smallest (or 2nd smallest) and largest (or 2nd largest) current maximums could be used for statistical guard bands. As yet another embodiment, archetypal analysis may be performed to determine the statistical guard bands. An exemplary discussion relating to archetypal analysis is presented in the article *Archetypal Analysis* by A. Cutler and Leo, Breinan published in Technometrics, Vol. 36, pp. 338–347, 1994, which is incorporated herein by reference in its entirety.

Finally, manufacturing guard band extractor 458 is used to identify the guard bands between ideal semiconductor device I/V curves or behavior and worst-case I/V curves from statistical analyzer 452.

Figure 5A:
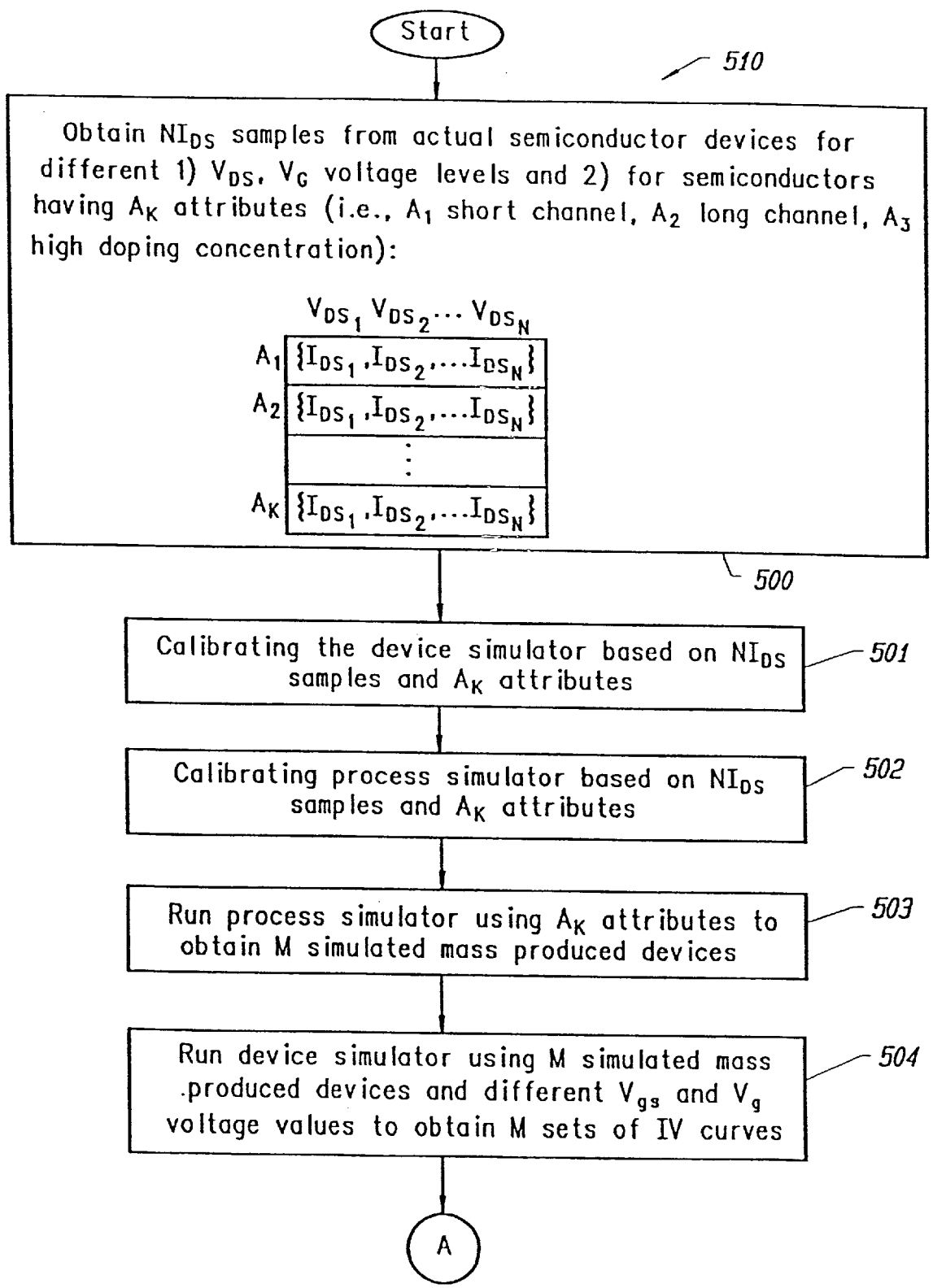
FIGS. 5a–b illustrate a logic flow diagram for modeling a mass-produced complex cell device in accordance with the present invention.
Figure 5B:
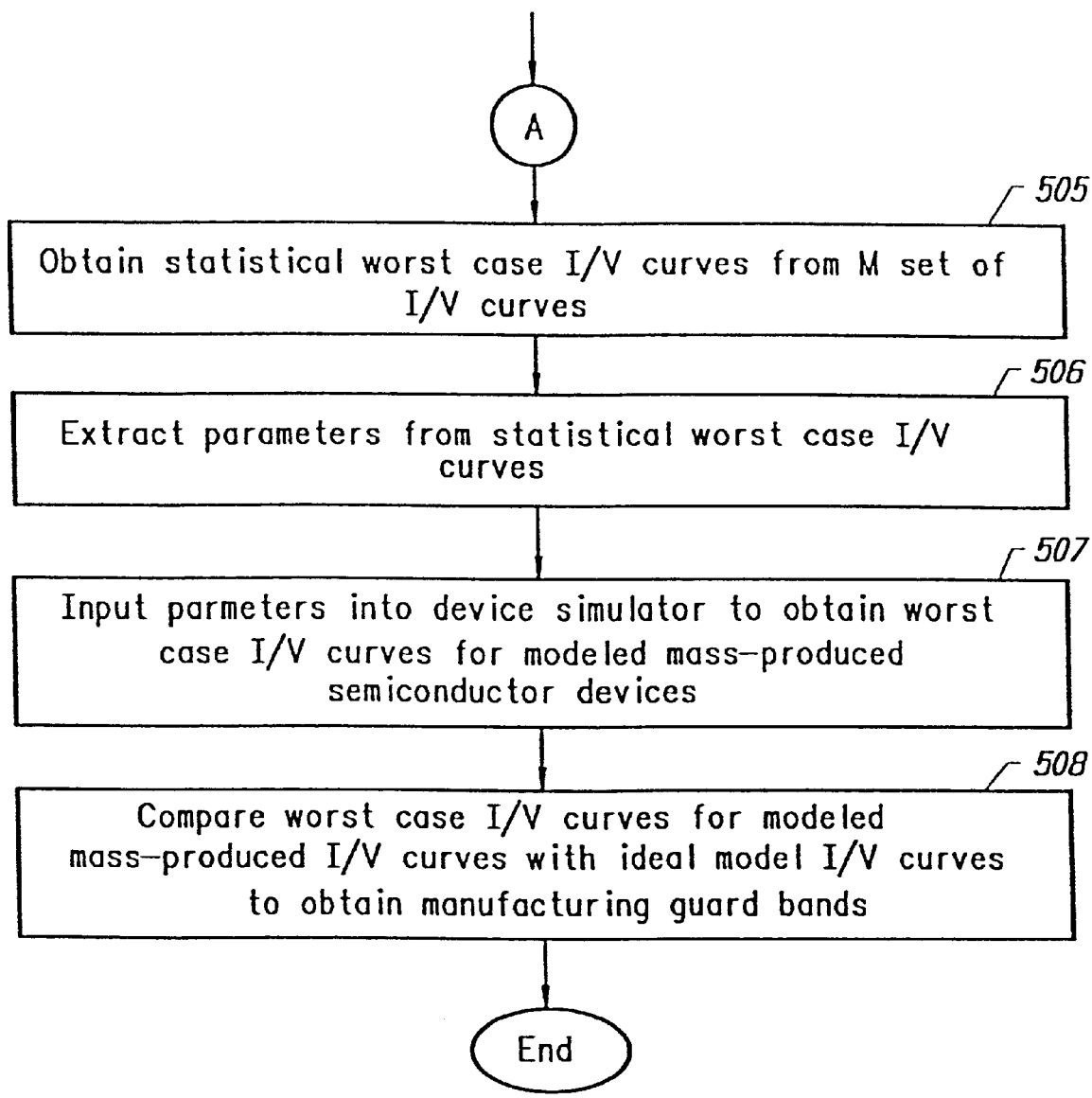

A method 510 for modeling a mass-produced complex cell device is illustrated in FIGS. 5a–b. In an exemplary embodiment, method 510 is a mass-produced complex cell device modeling software program which may be resident in the interactive design computer 304 shown in FIG. 3. It should be understood that the computer 304 may be programmed in accordance with well-known programming practices to automatically carry out most, if not all, of the steps of method 510 (one or more of the steps may be performed manually if desired).

At step 500, N drain-to-source current values $I_{DS}$ are obtained from actual semiconductor devices based upon N drain-to-source voltage values $V_{DS}$ and gate voltage values $V_G$ for various semiconductor devices having different attributes $A_K$. For example, a sampled semiconductor device $A_1$ may have a long channel length, while another sampled semiconductor device $A_2$ may have a short channel length.

At step 501, a device simulator, such as BSIM3 device simulator obtained from the Department of Electrical Engineering and Computer Science, University of California, Berkeley, Calif. 94770, is calibrated using the N drain-to-source current values $I_{DS}$ and N drain-to-source voltage values $V_{DS}$. Other device simulators, such as PISCES and MINIMOS, may likewise be used.

A process simulator, such as a SUPREM IV simulator, available from Avant! of Fremont, Calif., is calibrated in step 502 based upon the N drain-to-source current values $I_{DS}$ and N drain-to-source voltage values $V_{DS}$ and measured attributes of the K semiconductor devices. In an embodiment, eight semiconductor devices having varying attributes, such as channel length and doping concentration, are used.

In step 503, M simulated mass-produced semiconductor devices are then generated from running a process simulator using the $A_K$ attributes used in step 500.

In step 504, the M simulated mass-produced devices having various attributes obtained in step 503 are then input into a device simulator to obtain M sets of I/V curves based upon varying drain-to-source voltage values $V_{DS}$ and gate voltage values $V_G$. At step 505, worst-case I/V curves from the M set of I/V curves is obtained by averaging the drain-to-source current values $I_{DS}$ associated with respective drain-to-source voltage values $V_{DS}$. Parameters for a device simulator are extracted from the statistical worst-case I/V curves in step 506. A device parameter extractor and parameter software is used to obtain parameters from the statistical worst-case I/V curves.

A device simulator outputs worst-case I/V curves in step 507 in response to input parameters obtained from the statistical I/V curves. Finally, worst-case I/V curves may be compared to an ideal I/V curve, including mean values of IDS, to obtain manufacturing guard bands in step 508.

As described above, method 510 may be encoded in a software program stored in memory 304c in interactive design computer 304a, as illustrated in FIG. 3. In alternate embodiments, method 510 may be embodied in a software program stored on a computer readable medium, such as a magnetic or optical disk.

Figure 6A:
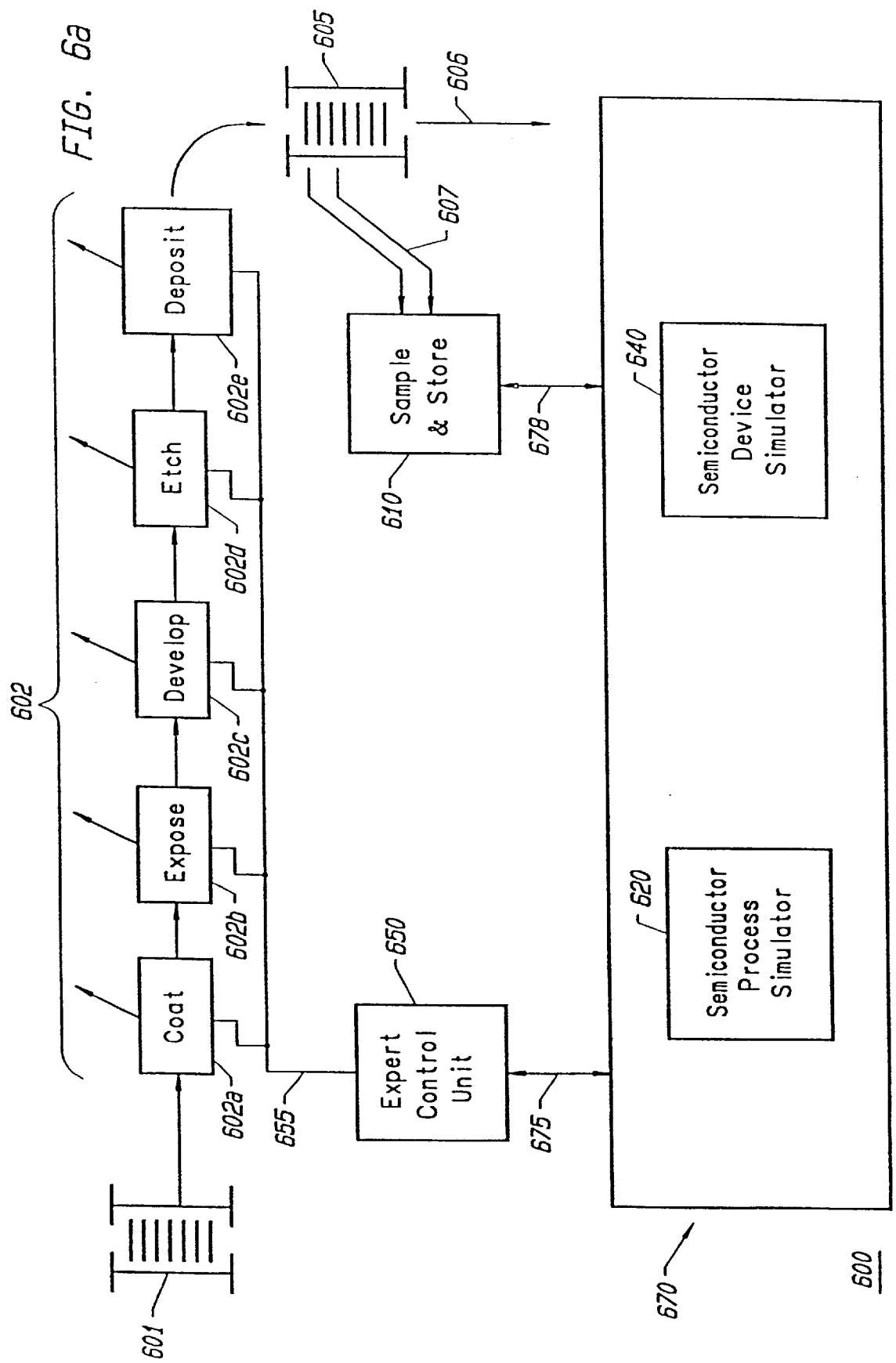
FIGS. 6a–c illustrate a wafer fabrication monitoring and correction system in accordance with the present invention.
Figure 6B:
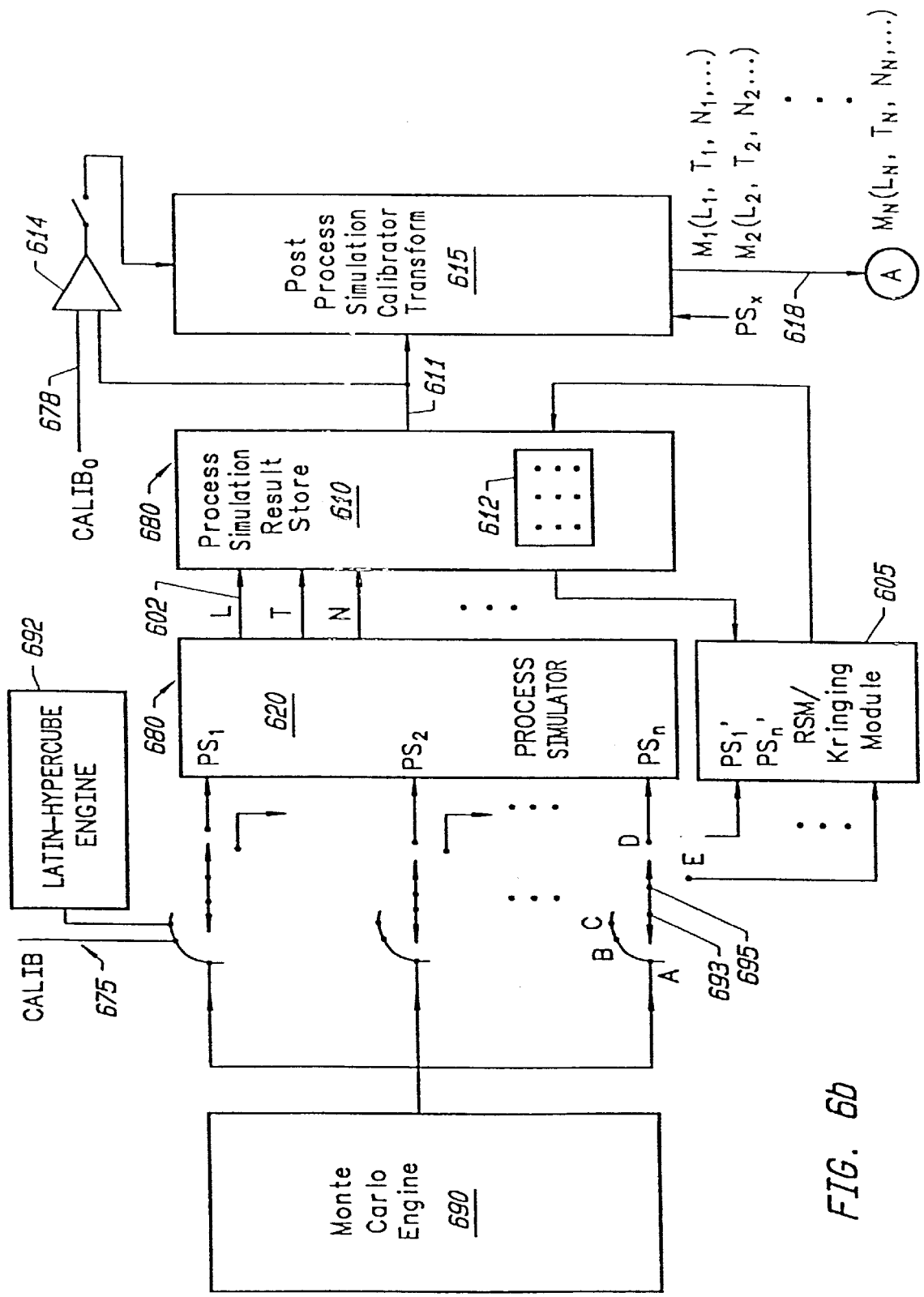

FIGS. 6a–b illustrates a fabrication line monitoring and correction system according to the present invention. As seen in FIG. 6a, an input lot 601 of wafers is supplied to mass-processing line 602. The number of wafers in a lot 601 can vary, but is typically on the order of 20–25 wafers per lot (the number of wafers held by a wafer transport cassette). The circuit layouts for the production on each wafer of a given lot are typically all the same.

The wafers of each lot 601 are moved through the mass-processing line 602 one after the next. After one lot 601 is input, a next lot having the same circuit design (not shown) is input, and another, and so forth. Typically, a large number of lots will be processed at one time for each type of to-be-produced circuit (e.g., a memory device, or a microprocessor, or a programmable logic device). The mass-processing line 602 is part of an overall wafer processing system referred to herein as 600. Processing line 602 includes: (1) a first station 602a for coating each wafer with material layers such as anti-reflection coating ("ARC") and photoresist ("PR") layers; (2) a second station 602b for exposing the material layers (the photoresist layer) to a radiation pattern; (3) a third station 602a for developing each exposed wafer; (4) a fourth station 602d for etching each developed wafer; and (5) a fifth station 602e for implant deposition for each wafer.

The output of processing line 602 is shown as post-doped implant wafer lot 605. After wafer lot 605 completes process line 602, two or more sample wafers from each post-doped wafer lot 605 are temporarily removed as indicated by dual lines 607. Semiconductor device attribute values, as well as drain-to-source current values $I_{DS}$, as a function of gate voltage values $V_G$ and drain-to-source voltage values $V_{DS}$ are measured. These values are input to mass-produced semiconductor device modeling system 670 on line 678.

The expert control unit 650 is coupled by way of control bus 655 to control the process parameters of one or more of the coating station 602a, the exposure station 602b, the development station 602c, the etch station 602d and the implant station 602e.

Expert controllable parameters of the coating station 602a may include the ARC layer thickness, the ARC refractive index (by choice of material) and the photoresist thickness. Controllable parameters of exposure unit 602b may include the mean focus depth, the exposure dosage, the partial coherence of the exposure radiation, the numeric aperture of the stepper optics and the phase shift angles of the mask. Controllable parameters of the developing station 602e may include the development time, development temperature and diffusion length (by choice of the photoresist material and development materials). Controllable parameters of the etch station 602d may include chamber pressure, flow rate, temperature, field intensity, and etch time. Controllable parameters of the dopant implant station 602c may include dopant type, dopant concentrations and energy level.

The control decisions of the expert control unit 650 are predicated on a computer-implemented mass-produced semiconductor modeling system 670 to which the expert control unit 650 is coupled by way of interface 675.

The modeling system 670 includes a semiconductor process simulator 620 that predicts the behavior of the processing line 602 (based on actually obtained semiconductor attribute measurements on line 678) and a semiconductor device simulator 640 that predicts the behavior of a semiconductor device manufactured on processing line 602.

The interface 675 between the expert control unit 650 and the process modeling system 670 carries both control signals for mediating the model creation operation and also consultation input/output data that lets the expert control unit 650 pose various queries to the process modeling system 670.

Connection 678 is used during the process and device simulator operation to calibrate the output data of the process simulator 620 and device simulator 640 to actual data held within the sample-and-store unit 610.

The expert control unit 650 may be implemented as a computer having a central or distributed processing unit and appropriately programmed memory. The modeling system 670 may also be implemented as part of the same computer system or may be implemented as separate hardware. The previously described sample-and-store unit 610 may be similarly implemented as separate hardware or incorporated into the computer system that includes the expert control unit 650.

Referring to FIG. 6b, the process modeling system 670 includes a process simulator 620 such as the DEPICT™ photolithography simulator available from Avant! of Fremont, Calif.. Other process simulators, of course, may be used in its place. Likewise, modeling system 670 includes a device simulator 610 such as BSIM3 device simulator available from the Department of Electrical Engineering and Computer Science, University of California, Berkeley, Calif. 94770.

Process simulator 620 receives a plurality of process parameter sample signals, $PS_1$ through $PS_n$. Signals $PS_1$–$PS_n$ represent process parameters present for the process simulated in process simulator 620 at a given instant of time. The process simulator 620 responsively outputs signals 602 representing critical process result values such as L (channel length), T (gate oxide thickness) and N (doping concentration) in the simulated manufactured semiconductor device.

Process simulation result data 602 is stored in a process simulation result storing memory 610. The process simulation result storing memory 610 includes a Latin Hypercube driven region 612 whose function will be described later.

The output 611 of the memory 610 drives a post-simulation calibration-transform module 615. Once calibrated, the calibration-transform module 615 operates according to multivariate correction equations to calibrate the process simulation results (which are typically in terms of normalized values) so they correspond with actual values held in the sample-and-store unit 610 of FIG. 6a.

The calibration transform parameters of the calibration-transform module 615 are set by a calibrating comparator 614 during a calibration mode. As will be later explained, the calibration-transform module 615 is preferably made responsive not only to the stored simulation results on output 611 but also to one or more of the applied process parameter signals, $PS_1$ through $PS_n$ ($PS_x$).

The output 618 of the calibration-transform module 615 provides a plurality of predicted semiconductor devices MN having semiconductor attributes (L, T, N . . . ) determined by process simulator 620.

The inputs of the process simulator 620 may be driven from a number of sources.

A plurality of n routing switches 693 are provided for supplying process parameter samples ($PS_1$, $PS_2$ . . . $PS_N$) from at least three different sources: (a) a calibration-mode real input 675; (b) a Monte Carlo engine 690 and (c) a Latin Hypercube engine 692.

In the case where the process parameter selecting switches 693 are in a first position (A) and the illustrated following group of n bypass switches 695 are in a direct-connect position (D), the noisy process parameters produced by Monte Carlo engine 690 are routed to process simulator 620. Process simulator 620 then evaluates the received inputs and generates corresponding predicted result values 602 which are stored in the result memory 610.

A large number of simulation runs are performed in order to store a statistically significant number of results in the result storage memory 610. The number of simulated runs is preferably on the order of 100 to 200, more preferably on the order of 400 runs, and even more preferably on the order of 800 or more runs.

Each run of the process simulator 620 takes a relatively long amount of time. It takes a corresponding multiple of that one-run time to perform the desired 100 to 800+ large number of noise-infected simulations.

If desired, the illustrated Monte Carlo engine 690 may be replaced with a Latin Hypercube sampling system that generates an essentially equivalent statistical pattern of noise-infected process parameter values ($PS_1$, $PS_2$ . . . $PS_N$) generated by Monte Carlo engine 690. In such a case, the number of Latin Hypercube sampling runs can be a smaller number to assure that a statistically meaningful result is obtained from the corresponding set of noisy simulations.

The time for gathering simulated result samples may be significantly reduced by bypassing the process simulator 620 and instead using a response surface modeler (RSM) in combination with a kriging error-correction interpolator. The combination of the RSM and kriging interpolator is referenced as block 605 in FIG. 6b. A neural net modeler could be used in place of the RSM/kriging module 605 if desired and trained to produce similar results.

To program the RSM portion of module 605, the parameter selecting switches 693 are first set to drive position (C). A Latin Hypercube engine 692 or its equivalent then supplies a regular matrix of process parameter samples over time for filling in a corresponding result region 612 in the result storing memory 610. In one particular embodiment, the Latin Hypercube engine 692 was designed to provides 51 runs through the process simulator 600 in order to produce the pre-simulated data of result region 612.

The response surface modeler (RSM) then scans result region 612 and develops a surface model for the data contained in that region 612. Error between the modeled surface and the actual data contained in region 612 is corrected by the kriging interpolator 605.

Next, the parameter source selecting switches 693 are reset to position (A) and the bypass switches 695 are set to bypass position (E). The larger number (e.g., 800 or so) of noisy Monte Carlo simulation runs are processed through the RSM/kriging module 605 rather than through the process simulator 600. In another embodiment, a smaller number of Latin Hypercube samples may be used to replace the Monte Carlo samples. Results are produced much faster for storage in simulation result storing memory 610. This means that more queries can be processed in a given time period. The overhead for this performance gain is the 51 or so additional runs for generating mapping region 612 with the Latin Hypercube engine 692.

In order to calibrate the post-simulation transform module 615, the parameter source selecting switches 693 are thrown into calibration position (B). Accurately measured process parameters from the real processing line 602 are fed in through connection 675 and the actually-observed results are supplied through calibration output feed 678 (from the sample and store memory 610 of FIG. 6a). Comparator 614 is activated and operates to find the transform parameters that minimize the error between the actual results on line 678 and the simulated results on line 611. Any one of a number of calibration and correction transforms may be used including a linear least-squares method. According to one specific aspect of the present invention, to provide a generic post-simulation calibration for all values of focus, it is preferable to connect transform module 615 to also receive the focus parameter $PS_{focus}$ ($PS_x$) from the input to switch set 695 so that the corrections illustrated in FIG. 6b and 6c can be automatically carried out by module 615 for any value of focus.

Figure 6C:
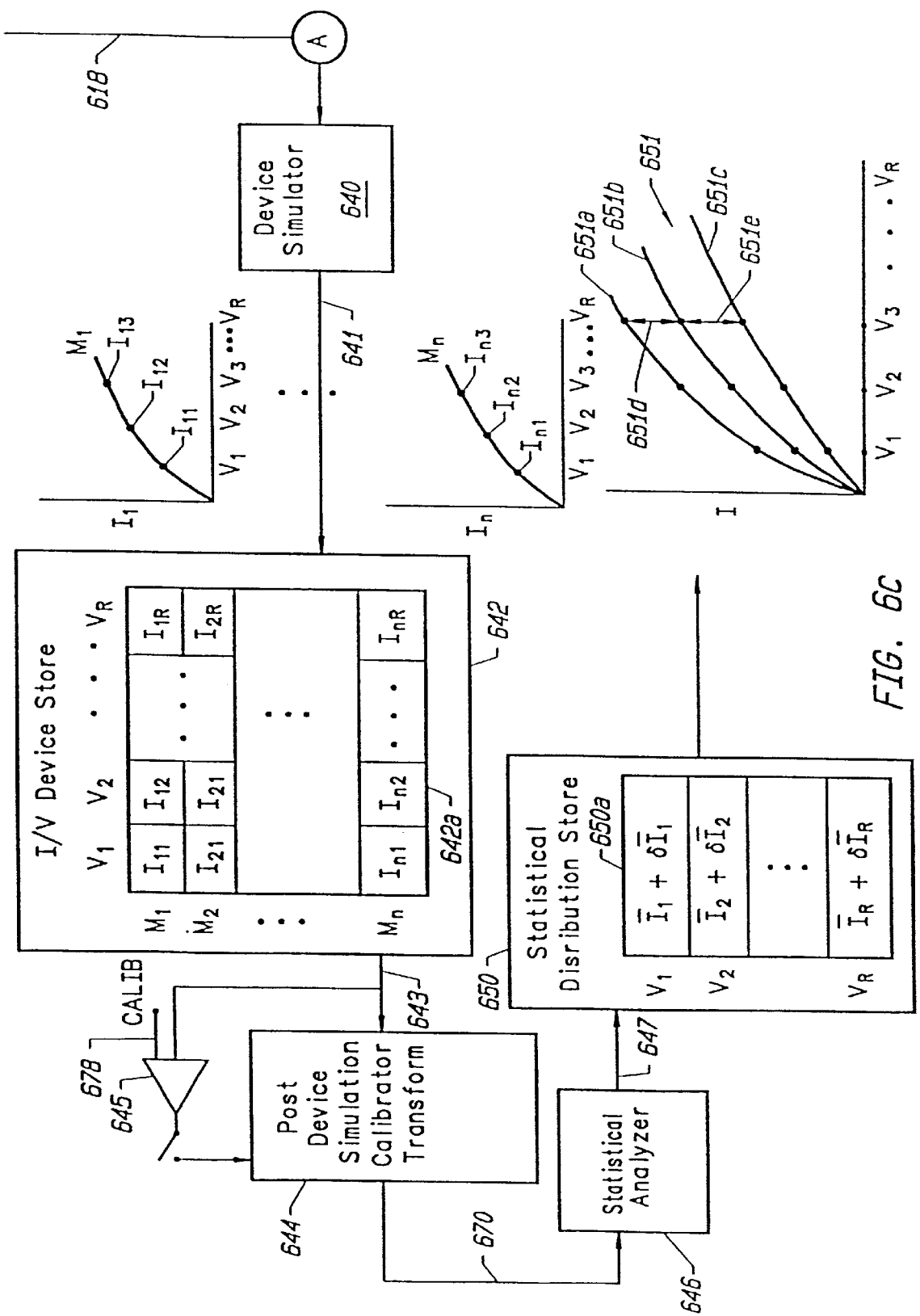

The M simulated mass-produced semiconductors having attributes L, T, N and so on are then input into device simulator 640 on line 618. Device simulator 640 then outputs a plurality of M I/V curves corresponding to the M simulated mass-produced semiconductor devices, as shown in FIG. 6c. For example, a first simulated mass-produced semiconductor device M, has an I/V curve, in particular drain-to-source current values $I_{11}, I_{12}, I_{13}$ corresponding to drain-to-source voltage values $V_1, V_2, V_3 \ldots V_R$. Likewise, semiconductor device $M_n$ has corresponding drain-to-source current values $In_1, In_2, In_3 \ldots$ stored in I/V device store 642. In particular, a table 642a, consisting of n rows of simulated mass semiconductor devices and R columns of corresponding drain-to-source voltage values is built.

These drain-to-source current values are then output on line 643 to post device simulated calibrator transform 644 and to comparator 645. Post device simulation calibrator transform 644 and comparator 645 operate similarly to post process simulation calibrator transform 615 and comparator 614 as shown in FIG. 6b. Actual drain-to-source current values corresponding to the voltage values $V_1, V_2, V_3 \ldots V_R$ are input on line 678 to comparator 645.

Comparator 645 is activated and operates to find the transform value that minimize the error between the actual current results on line 678 and the simulated current values on line 643. As with transform 615, any one of a number of calibration and correction transforms may be used including a linear least-squares method. The simulated current values stored in I/V device store 642 then may be calibrated by transform 644.

The calibrated current values are then output on line 670 to statistical analyzer 646. Statistical analyzer 646 creates a mean $_R$ and standard deviation $\sigma I_R$ associated with each of the drain-to-source voltage values $V_1, V_2, V_3 \ldots V_R$ and outputs the results on line 647 to statistical distribution store 650. Statistical distribution store 650 includes a Table 650a having corresponding mean $_R$ and standard deviation current values $\sigma I_R$ corresponding to the R drain-to-source voltage values. In an alternate embodiment, a smallest (or 2nd smallest) and largest (or 2nd largest) current maximum could be used for statistical guard bands. Based upon the mean current and standard deviation values in Table 650a, worst-case I/V curves 651a and 651c may be constructed along with an idealized I/V curve 651b. Manufacturing guard bands 651d and 651e then may be determined based upon the difference between idealized I/V curve 651b (consisting of mean $_R$ values) and worst-case curves 651a and 651c. The curves 651a and 651c consist of positive and negative 3 $\sigma_R$ values. Moreover, probabilities may be assigned to various curves constructed within the worst-case curves to identify manufactured guard bands. A parameter extractor device and software then may be used to obtain parameters associated with curves 651, 651a and 651c.

Thus, the present invention provides for modeling or simulating a semiconductor device manufactured under typical mass-produced conditions by obtaining worst case extreme parameters that are more realistic or practical than worst case extreme parameters obtained via conventional techniques. As a result of the present invention, IC circuits may be manufactured more densely without substantially sacrifice operability.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A method for facilitating designing an integrated circuit, comprising the steps of:

propagating process parameter data from a process simulator to obtain normalized distributions of electrical properties of the process parameter data relating to manufacturing an integrated circuit;

dividing up the integrated circuit into at least one simple standard cell and at least one complex cell;

modeling the at least one simple standard cell as a circuit, and using the propagated process parameter data to determine at least one attribute of the at least one simple standard cell;

using the propagated process parameter data to determine a drain-to-source current and drain-to-source voltage relationship for the at least one complex cell; and determining at least one worst case design parameter for the integrated circuit using the at least one attribute of the simple standard cell and the at least one drain-to-source current and drain-to-source voltage relationship of the at least one complex cell.

2. The method of claim 1, wherein the at least one attribute of the at least one simple standard cell is gate delay.

3. The method of claim 1, wherein the at least one attribute of the at least one simple standard cell is power consumption.

4. The method of claim 1, wherein a simple standard cell simulator is used to determine the at least one attribute of the at least one simple standard cell.

5. The method of claim 1, wherein a complex cell simulator is used to determine the drain-to-source current and drain-to-source voltage relationship for the at least one complex cell.

6. The method of claim 1, wherein a statistical analyzer is used to determine the at least one worst case design parameter for the integrated circuit.

7. The method of claim 1, wherein the process parameter data are actual measurements collected from a fabrication facility.

8. The method of claim 1, wherein the process parameter data are anticipated measurements.

9. The method of claim 1 further including statistical process modeling of intra-field variations, intra-field variations including process variations encountered during manufacturing.

10. The method of claim 1, wherein a Latin Hypercube engine is used to determine the at least one worst case design parameter for the integrated circuit.

11. The method of claim 1, wherein a Monte Carlo engine is used to determine the at least one worst case design parameter for the integrated circuit.

12. A system for facilitating designing an integrated circuit, comprising:

a process simulator for propagating process parameter data from a process simulator to obtain normalized distributions of electrical properties of the process parameter data relating to manufacturing an integrated circuit;

a device simulator operatively coupled to the process simulator for dividing up the integrated circuit into at least one simple standard cell and at least one complex cell; the device simulator modeling the at least one simple standard cell as a circuit, using the propagated process parameter data to determine at least one attribute of the at least one simple standard cell, and using the propagated process parameter data to determine a drain-to-source current and drain-to-source voltage relationship for the at least one complex cell; and a statistical analyzer operatively coupled to the device simulator for determining at least one worst case design parameter for the integrated circuit using the at least one attribute of the at least one simple standard cell and the at least one drain-to-source current and drain-to-source voltage relationship of the at least one complex cell.

13. The system of claim 12, wherein the at least one attribute of the at least one simple standard cell is gate delay.

14. The system of claim 12, wherein the at least one attribute of the at least one simple standard cell is power consumption.

15. The system of claim 12, wherein the device simulator includes at least one simple standard cell simulator for determining the at least one attribute of the at least one simple standard cell and at least one complex cell simulator for determining the drain-to-source current and drain-to-source voltage relationship for the at least one complex cell.

16. The system of claim 12, wherein the process parameter data are actual measurements collected from a fabrication facility.

17. The method of claim 12, wherein the process parameter data are anticipated measurements.

18. The system of claim 12, wherein a Latin Hypercube engine is used to determine the at least one worst case design parameter for the integrated circuit.

19. The system of claim 12, wherein a Monte Carlo engine is used to determine the at least one worst case design parameter for the integrated circuit.

20. A design apparatus for modeling a mass-produced semiconductor device, comprising:

display means for displaying data to a user;

input means for supplying input data in response to a user's input;

a memory, coupled to the display and the input means, for storing a computer software program; and a processor, coupled to the display, the input means and the memory, for controlling the memory, the input means, and the display means in response to the stored computer software program and input data to perform data processing operations;

wherein the stored software program includes:

(a) means for providing a plurality of simulated mass-produced semiconductor devices responsive to a plurality of process parameters, wherein the plurality of simulated semiconductor devices have associated attributes;

(b) means for differentiating a simple standard semiconductor device from a complex semiconductor device, and providing a plurality of semiconductor device behaviors respectively responsive to the plurality of simulated mass-produced semiconductor devices; and (c) means for obtaining a worst-case semiconductor device behavior responsive to the plurality of semiconductor behaviors.

21. The design apparatus of claim 20, wherein the semiconductor device is a simple standard cell.

22. The design apparatus of claim 21, wherein the simple standard cell is one of a XOR circuit, NAND circuit, NOR circuit, and inverter circuit.

23. The design apparatus of claim 21, wherein the semiconductor device behaviors include gate delays and power consumption.

24. The design apparatus of claim 20, wherein the semiconductor device is a complex cell.

25. The design apparatus of claim 24, wherein the semiconductor device behaviors include drain-to-source current and drain-to-source voltage values.

26. The design apparatus of claim 20, wherein the semiconductor device attributes include channel length.

27. The design apparatus of claim 20, wherein the means for providing a plurality of semiconductor device behaviors include a device simulator.

28. The design apparatus of claim 20, wherein the means for providing a plurality of mass-produced simulated semiconductor devices includes a process simulator.

29. The design apparatus of claim 20, further including:

calibrating means for providing a plurality of semiconductor device behaviors; and calibrating means for providing a plurality of simulated mass-produced semiconductor devices, responsive to actual device behaviors and actual semiconductor device attributes, respectively.

30. The design apparatus of claim 20, wherein the input data includes process parameters, semiconductor behaviors, and semiconductor attributes.

31. The design apparatus of claim 20, wherein the stored software program further includes means for providing process parameters.

32. The design apparatus of claim 20, wherein the means for providing process parameters includes a Monte Carlo engine.

33. The design apparatus of claim 20, wherein the means for providing process parameters includes a Latin Hypercube engine.

* * * * *

UNITED STATES PATENT AND TRADEMARK OFFICE
CERTIFICATE OF CORRECTION

PATENT NO. : 6,304,836 B1
DATED : October 16, 2001
INVENTOR(S) : Zoran Krivokapic et al.

It is certified that error appears in the above-identified patent and that said Letters Patent is hereby corrected as shown below:

Column 2,
Line 43, please replace "IN" with -- I/V --.

Column 13,
Line 51, please replace "IDS" with -- $I_{DS}$ --.

Column 15,
Line 45, please replace "MN" with -- $M_N$ --.

Column 17,
Line 7, please replace "M" with -- $M_1$ --.

Signed and Sealed this

Twelfth Day of March, 2002

*Attest:*

JAMES E. ROGAN
*Attesting Officer*     *Director of the United States Patent and Trademark Office*